(12) United States Patent
Arelakis et al.

(10) Patent No.: US 12,360,895 B2
(45) Date of Patent: Jul. 15, 2025

(54) SYSTEMS, METHODS AND DEVICES FOR EXPLOITING VALUE SIMILARITY IN COMPUTER MEMORIES

(71) Applicant: ZEROPOINT TECHNOLOGIES AB, Gothenburg (SE)

(72) Inventors: Angelos Arelakis, Hovås (SE); Alexandra Angerd, Mölndal (SE); Erik Sintorn, Gothenburg (SE); Per Stenström, Torslanda (SE)

(73) Assignee: ZEROPOINT TECHNOLOGIES AB, Gothenburg (SE)

( * ) Notice: Subject to any disclaimer, the term of this patent is extended or adjusted under 35 U.S.C. 154(b) by 223 days.

(21) Appl. No.: 18/254,651

(22) PCT Filed: Dec. 1, 2021

(86) PCT No.: PCT/SE2021/051191
§ 371 (c)(1),
(2) Date: May 26, 2023

(87) PCT Pub. No.: WO2022/119493
PCT Pub. Date: Jun. 9, 2022

(65) Prior Publication Data
US 2024/0028510 A1 Jan. 25, 2024

(30) Foreign Application Priority Data
Dec. 1, 2020 (SE) .................... 2051404-8

(51) Int. Cl.
*G06F 12/0802* (2016.01)
*H03M 7/42* (2006.01)
*G06F 3/06* (2006.01)

(52) U.S. Cl.
CPC .......... *G06F 12/0802* (2013.01); *H03M 7/42* (2013.01); *G06F 3/0608* (2013.01);
(Continued)

(58) Field of Classification Search
CPC .. G06F 12/0802; G06F 3/0608; G06F 3/0673; G06F 3/0646; H03M 7/42
See application file for complete search history.

(56) References Cited

U.S. PATENT DOCUMENTS

2018/0052611 A1* 2/2018 Guilford ............... G06F 3/0646
2019/0138500 A1 5/2019 Sharangpani

FOREIGN PATENT DOCUMENTS

WO WO 2016186563 A1 11/2016
WO WO 2017131578 A1 8/2017
(Continued)

OTHER PUBLICATIONS

International Search Report and Written Opinion were mailed on Jan. 19, 2022 by the International Searching Authority for International Application No. PCT/SE2021/051191 filed on Jan. 12, 2021 and published as WO2022119493 (Applicant—Zeropoint Technologies AB) (10 pages).
(Continued)

*Primary Examiner* — Joseph J Lauture
(74) *Attorney, Agent, or Firm* — Ballard Spahr LLP

(57) ABSTRACT

A data compression method is disclosed which involves obtaining a plurality of data blocks, each data block comprising a plurality of data values. The method performs base-delta encoding of the obtained plurality of data blocks, wherein a delta value means a difference between a data value and a base value. This involves determining, among the data values of the plurality of data blocks, a set of global base values common to said plurality of data blocks. The set of global base values is selected to minimize delta values for the data values of the plurality of data blocks with respect to the global base values in said set of global base values. The method further involve encoding individual data values of the plurality of data blocks by selecting, in the set of global base values, for each individual data value a global base (Continued)

value that is numerically closest to the individual data value and thus results in a smallest delta value, and then generating metadata for the encoded individual data value to represent the selected global base value and the resulting delta value.

35 Claims, 30 Drawing Sheets

(52) U.S. Cl.
CPC .... *G06F 3/0673* (2013.01); *G06F 2212/1016* (2013.01); *G06F 2212/401* (2013.01)

(56) References Cited

FOREIGN PATENT DOCUMENTS

| WO | WO 2020101564 A1 | 5/2020 |
|----|------------------|--------|
| WO | WO2020130929 A1 | 6/2020 |
| WO | WO 2020145874 A1 | 7/2020 |

OTHER PUBLICATIONS

G. Pekhimenko, V. Seshardi, O. Mutlu, M. A. Kozuch, P. B. Gibbons and T. C. Mowry, "Base-delta-immediate compression: Practical data compression for on-chip caches".

International Report on Patentability was mailed on Aug. 30, 2022 by the International Preliminary Examining Authority for International Application No. PCT/SE2021/051191 filed on Jan. 12, 2021 and published as WO2022119493 (Applicant—Zeropoint Technologies AB) (16 pages).

Onur Mutlu et al., Seminar in Computer-Architecture, "Base-Delta-Immediate Compression: Practical Data Compression for on-Chip Caches," 2019, 77 pages.

* cited by examiner

SYSTEMS, METHODS AND DEVICES FOR EXPLOITING VALUE SIMILARITY IN COMPUTER MEMORIES

CROSS-REFERENCE TO RELATED APPLICATIONS

This application is a U.S. National Phase Application of International Application No. PCT/SE2021/051191, filed Dec. 1, 2021, which claims priority to Swedish Application No. 2051404-8, filed Dec. 1, 2020, each of which are hereby incorporated by reference in their entirety.

TECHNICAL FIELD

This subject matter generally relates to the field of data compression in memories in electronic computers.

BACKGROUND

Data compression is a general technique to store and transfer data more efficiently by coding frequent collections of data more efficiently than less frequent collections of data. It is of interest to generally store and transfer data more efficiently for a number of reasons. In computer memories, for example memories that keep data and computer instructions that processing devices operate on, for example in main or cache memories, it is of interest to store said data more efficiently, say K times, as it then can reduce the size of said memories potentially by K times, using potentially K times less communication capacity to transfer data between one memory to another memory and with potentially K times less energy expenditure to store and transfer said data inside or between computer systems and/or between memories. Alternatively, one can potentially store K times more data in available computer memory than without data compression. This can be of interest to achieve potentially K times higher performance of a computer without having to add more memory, which can be costly or can simply be less desirable due to resource constraints. As another example, the size and weight of a smartphone, a tablet, a lap/desktop or a set-top box can be limited as a larger or heavier smartphone, a tablet, a lap/desktop or a set-top box could be of less value for an end user; hence potentially lowering the market value of such products. Yet, making more memory capacity or higher memory communication bandwidth available can potentially increase the market value of the product as more memory capacity or memory communication bandwidth can result in higher performance and hence better utility of the product.

To summarize, in the general landscape of computerized products, including isolated devices or interconnected ones, data compression can potentially increase the performance, lower the energy expenditure, increase the available memory communication bandwidth or lower the cost and area consumed by memory. Therefore, data compression has a broad utility in a wide range of computerized products beyond those mentioned here.

Compressed memory systems in prior art typically compress a memory page when it is created, either by reading it from disk or through memory allocation. Compression can be done using a variety of well-known methods by software routines or by hardware accelerators. When processors request data from memory, data must typically be first decompressed before serving a requesting processor. As such requests may end up on the critical memory access path, decompression is typically hardware accelerated to impose a low impact on the memory access time.

To impose a low impact on the memory access time and yet be able to effectively compress data in a memory object, say a page of memory, data is typically compressed data-block by data-block. Here, a data block can be 64 bytes although it can be less or more. A data block may contain a number of values, for example, integers or floating-point values (sometimes referred to as floats) or other data types. For example, a 64-byte data block may contain sixteen 32-bit integers or floats.

Compression techniques can be lossless or lossy. Lossless compression techniques preserve the information so that a value that is compressed in a lossless fashion can be restored exactly after being decompressed. In contrast, lossy compression techniques do not preserve all of the information. On the other hand, when a value is compressed in a lossy fashion it will not be restored exactly after decompression. The difference between the original and the restored value is referred to as compression error. A challenge is to keep that error bounded and low.

In one family of lossless compression techniques, referred to as delta compression, known from prior art, the approach taken is to exploit value similarity in a collection of data values that are numerically close. By choosing a base value that is numerically close to said collection of data values, one only needs to keep track of the differences, called delta values, between each individual value and the base value.

For example, in base-delta-immediate compression (henceforth, referred to as BDI), a base value for a data block is picked arbitrarily among the values associated with said data block. The data block is compressed by keeping track of the difference between each value in the block and said base value. If all the values within a data block are numerically similar, said differences will be small. For example, if a data block contains the four values 100, 98, 102 and 105 and the first value (100) is picked as a base value, the differences would be 0, −2, 2 and 5.

It is possible to store the exemplary data block more compactly by only storing the differences, henceforth referred to as delta values, and the base value. In the example, the original block would need 4×32=128 bits of storage, whereas BDI would ideally need only 32+3×4=44 bits assuming that the range for the delta values is [−8, 7], yielding 4 bits to store the delta value. This leads to a compression degree (or sometimes referred to as ratio) of 128/44=3 times.

BDI is attractive because it can be implemented by a hardware-accelerated compression and decompression device that compresses/decompresses a data block by simply subtracting/adding the base value from/to the original value/delta value. However, it works effectively only if values within a data block are numerically similar. Otherwise, the metadata needed to encode the delta values can offset the gains from compression. Consider, for example, two blocks— B1 and B2— with four values each, where B1 contains the values 100, 102, 205, 208 and B2 contains 200, 202, 105, 108. BDI may pick 100 as the base value for B1 and encode delta values as 0, 2, 105 and 108. In contrast, BDI may pick 200 as the base value for B2 and encode delta values as 0, 2, −95 and −92. Clearly, in this example, the larger amount of metadata to encode the delta values may reduce the compression effectiveness of BDI. If the base values could have been shared between B1 and B2, metadata could be reduced.

The challenging problem that this patent disclosure addresses is: Given a data set stored in a plurality of data blocks, how to devise systems, methods and devices that can select a set of base values that can be shared by a plurality of data blocks. A first challenge is to devise a method and a device configured to select, among said plurality of data blocks, a set of base values that will reduce the amount of metadata to encode the delta values among the plurality of data blocks effectively. A second challenge is how to devise a method and a device configured to effectively manage the compression and decompression process through hardware accelerators.

Selecting base values will lead to an encoding scheme where delta values are encoded explicitly. However, delta values may exhibit value redundancy meaning repeated values that could be encoded compactly. For example, consider again the two exemplary data blocks: B1 comprises the values 100, 102, 205, 208 and B2 comprises the values 200, 202, 105, 108. If the base values are 100 and 200, the delta values of B1 are 0, 2, 5 and 8 and the delta values of B2 are 0, 2, 5 and 8. This example shows that the delta values can expose value redundancy which can be exploited. Specifically, delta value number k in B1 is in the example the same as delta value k in B2.

This patent disclosure, additionally, addresses the problem of how to devise systems, methods and devices configured to exploit value redundancy of the delta values encoded in combination using prior art methods.

In a family of lossy compression techniques applied to floating-point values, the goal is to achieve a high compression degree (or sometimes called ratio) by disregarding the least significant bits through truncation. For example, one could disregard the n least significant bits of the mantissa. Truncation has the effect that the information entropy of the remaining bits in the mantissa will substantially decrease making it possible to use delta compression or any other family of existing compression techniques to effectively reduce the size of floating-point values. Unfortunately, truncation may lead to high error rates. This invention, finally, addresses the problem of how to devise systems, methods and devices configured to maintain a high compression ratio for floating-point values and a substantially lower error rate by selecting how to represent the disregarded n least significant bits of mantissas in floating-point numbers.

SUMMARY

A first aspect of the present invention is a data compression method that comprises obtaining a plurality of data blocks, each data block comprising a plurality of data values. The method involves performing base-delta encoding of the obtained plurality of data blocks, wherein a delta value means a difference between a data value and a base value, by first determining, among the data values of the plurality of data blocks, a set of global base values common to said plurality of data blocks. The set of global base values is selected to minimize delta values for the data values of the plurality of data blocks with respect to the global base values in the set of global base values. The method then involves encoding individual data values of the plurality of data blocks by selecting, in the set of global base values, for each individual data value a global base value that is numerically closest to the individual data value and thus results in a smallest delta value, and generating metadata for the encoded individual data value to represent the selected global base value and the resulting delta value.

A second aspect of the present invention is a data compression device for performing base-delta encoding of an obtained plurality of data blocks, each data block comprising a plurality of data values, wherein a delta value means a difference between a data value and a base value. The data compression device comprises an analyzer unit configured for determining, among the data values of the plurality of data blocks, a set of global base values common to the plurality of data blocks. The set of global base values is selected to minimize delta values for the data values of the plurality of data blocks with respect to the global base values in the set of global base values. The data compression device further comprises an encoder unit configured for encoding individual data values of the plurality of data blocks by selecting, in the set of global base values, for each individual data value a global base value that is numerically closest to the individual data value and thus results in a smallest delta value, and generating metadata for the encoded individual data value to represent the selected global base value and the resulting delta value.

A third aspect of the present invention is a data decompression method, that comprises obtaining the metadata as generated by the data compression method according to the first aspect of the present invention, and reconstructing a plurality of data blocks, each data block comprising a plurality of data values, from the global base values and delta values represented by the obtained metadata.

A fourth aspect of the present invention is a data decompression device comprising a decoder unit, wherein the decoder unit is configured for obtaining the metadata as generated by the data compression device according to the second aspect of the present invention, and for reconstructing a plurality of data blocks, each data block comprising a plurality of data values, from the global base values and delta values represented by the obtained metadata.

A fifth aspect of the present invention is a system comprising one or more memories, a data compression device according to the second aspect of the present invention and a data decompression device according to the fourth aspect of the present invention.

A sixth aspect of the present invention is a computer program product comprising code instructions which, when loaded and executed by a processing device, cause performance of the method according to the first aspect of the present invention. Alternatively or additionally, the sixth aspect of the present invention can be seen as a computer-readable storage medium comprising a computer program comprising code instructions stored thereon, wherein the code instructions, when loaded and executed by a processing device, cause performance of the method according to the first aspect of the present invention.

A seventh aspect of the present invention is a computer program product comprising code instructions which, when loaded and executed by a processing device, cause performance of the method according to the third aspect of the present invention. Alternatively or additionally, the seventh aspect of the present invention can be seen as a computer-readable storage medium comprising a computer program comprising code instructions stored thereon, wherein the code instructions, when loaded and executed by a processing device, cause performance of the method according to the third aspect of the present invention.

A further aspect of the present invention is a computer memory compression method. The method comprises analyzing computer memory content with respect to selecting a set of base values. The method also comprises encoding said computer memory content by representing values in all data blocks by the delta values with respect to the set of base values picking the base value that minimizes the delta value for each value in a data block. The method may, additionally, comprise how to exploit value redundancy among delta values using any entropy-based or deduplication-based compression method known from prior art such as Huffman encoding or arithmetic encoding. Furthermore, a method is presented to decompress data values compressed with delta encoding using a set of established base values and where delta values are encoded using entropy-based or deduplication-based compression methods.

Another aspect of the present invention is a computer memory compression device. The device comprises an analyzer unit configured to select a set of base values to reduce the size of the delta values in a plurality of data blocks in comparison with using an arbitrary base value in each data block. The device also comprises an encoder unit configured to encode said computer memory content by using the set of selected base values common to a plurality of data blocks to establish a delta value for each value. The encoder unit is further being configured to provide metadata representing data values of the encoded computer memory content and devices configured for decompressing data values. The encoder unit is also configured to encode delta values more compactly using any entropy-based compression method known from prior art such as Huffman coding or arithmetic coding or deduplication-based and devices configured to decompress data values compressed with delta encoding using a set of established base values and where delta values are encoded using entropy-based or deduplication-based compression methods.

Other aspects, as well as objectives, features and advantages of the disclosed embodiments will appear from the following detailed patent disclosure, from the attached dependent claims as well as from the drawings.

Generally, all terms used in the claims are to be interpreted according to their ordinary meaning in the technical field, unless explicitly defined otherwise herein. All references to "a/an/the [element, device, component, means, step, etc.]" are to be interpreted openly as referring to at least one instance of the element, device, component, means, step, etc., unless explicitly stated otherwise. The steps of any method disclosed herein do not have to be performed in the exact order disclosed, unless explicitly stated.

DETAILED DESCRIPTION

This document discloses systems, methods, devices and computer program products to compress data in computer memory with a family of compression approaches that exploit value similarity for compact encoding of values in computer memories by identifying global base values and using entropy-based encodings to store delta values compactly.

Figure 1:
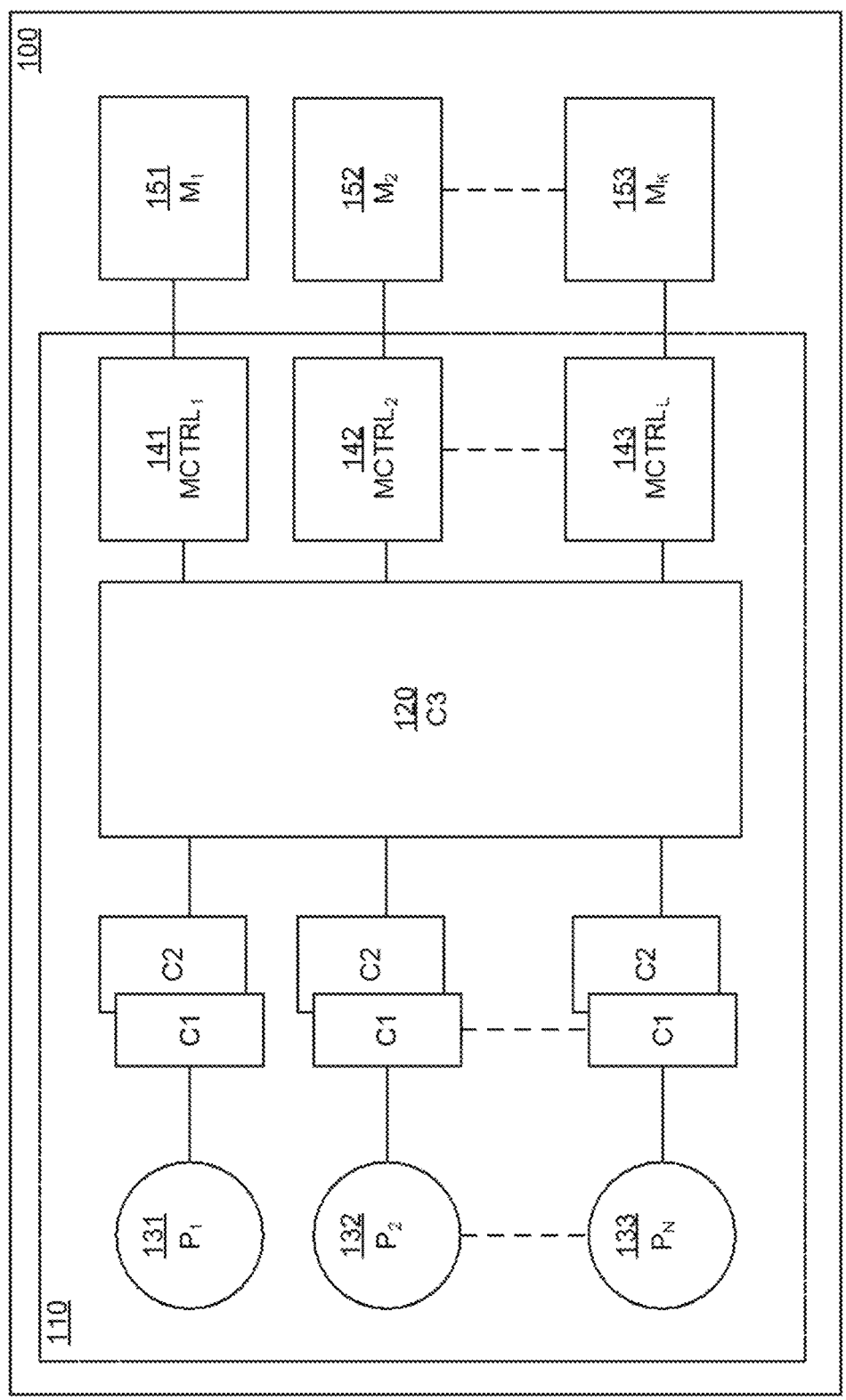
FIG. 1 depicts an exemplary computer system comprising a microprocessor chip with one or a plurality of processing units, an exemplary cache hierarchy of three levels, one or a plurality of memory controllers connected to one or a plurality of off-chip memories.

An exemplary embodiment of a computer system 100 is depicted in FIG. 1. This system comprises a microprocessor chip 110 and one or a plurality of memory modules denoted $M_1$ 151, $M_2$ 152 through $M_K$ 153. The microprocessor chip could be a discrete system or integrated on a system-on-a-chip (SoC) in any available technology. The microprocessor 110 comprises one or several processing units, denoted $P_1$ 131, $P_2$ 132 through $P_N$ 133 sometimes called CPU or core and a memory hierarchy. The memory hierarchy, on the other hand, comprises several cache levels, e.g. three levels as is shown exemplary in FIG. 1 and denoted C1, C2, and C3. These levels can be implemented in the same or different memory technologies, e.g. SRAM, DRAM, or any type of non-volatile technology including for example Phase-Change Memory (PCM). The number of cache levels may vary in different embodiments and the exemplary embodiment 100 depicts three levels where the last cache level is C3 120. These levels are connected using some kind of interconnection means (e.g. bus or any other interconnection network). In the exemplary embodiment, levels C1 and C2 are private to, and only accessible by, a respective processing unit i denoted Pi (e.g. $P_1$ in FIG. 1). It is well known to someone skilled in the art that alternative embodiments can have any number of private cache levels or, as an alternative, all cache levels are shared as illustrated by the third level C3 120 in FIG. 1. Regarding the inclusion of the data in the cache hierarchy, any embodiment is possible and can be appreciated by someone skilled in the art. For example, C1 can be included in C2 whereas C2 can be non-inclusive with respect to level C3. Someone skilled in the art can appreciate alternative embodiments. The computer system 100 of FIG. 1 comprises one or a plurality of memory controllers, denoted $MCTRL_1$ 141, $MCTRL_2$ 142, through $MCTRL_L$ 143. The last cache level (C3 in FIG. 1) is connected to the memory controllers, which in turn are connected to one or a plurality of memory modules. Memory controllers can be integrated on the microprocessor chip 110 or can be implemented outside the microprocessor chip. Finally, a computer system runs one or more tasks. A task can be any software application or part of it that can run on the particular system.

Computer systems, as exemplified by the embodiment in FIG. 1, can suffer from a limited capacity of the memories denoted $M_1$ 151 through $M_K$ 153 and of the cache memories, regardless of level (e.g. C1, C2 and C3 in FIG. 1). A limited cache capacity can manifest itself as a higher fraction of memory requests having to be serviced at the next level in the memory hierarchy leading to losses in performance or higher energy consumption. To mitigate this problem, one can consider increasing cache capacity, thereby lowering the number of requests that need to be serviced by the next level of the memory hierarchy. Increasing the capacity of the cache levels on a microprocessor chip will lead to a number of problems. First, the cache access request time can increase leading to performance losses. Second, the energy consumed on an access request to a larger cache can potentially be higher. Third, using up more of the silicon or equivalent material on the microprocessor chip to realize larger cache levels may have to be traded for less processing capabilities. It is therefore desirable to realize more cache capacity without the problems identified above. A limited memory capacity has similar problems and can manifest itself in more memory requests that will have to be serviced at the next level of the memory hierarchy typically realized as the storage level of the memory hierarchy. Such storage-level accesses are slower and may result in considerable losses in performance and energy expenditure. Increasing the memory capacity can mitigate these drawbacks. However, more memory capacity can increase the cost of the computer system both at the component level or in terms of energy expenditure. In addition, more memory consumes more space, which may limit the utility of the computer system in particular in form-factor constrained products including for example mobile computers (e.g., tablets, smart phones, wearables and small computerized devices connected to the Internet).

This patent disclosure considers several embodiments that differ at which level of the aforementioned exemplary memory hierarchy compression is applied. A first embodiment considers the invented compression method being applied at the main memory. However, other embodiments can be appreciated by someone skilled in the art. It is the intent that such embodiments are also contemplated while not being explicitly covered in this patent disclosure.

Figure 2:
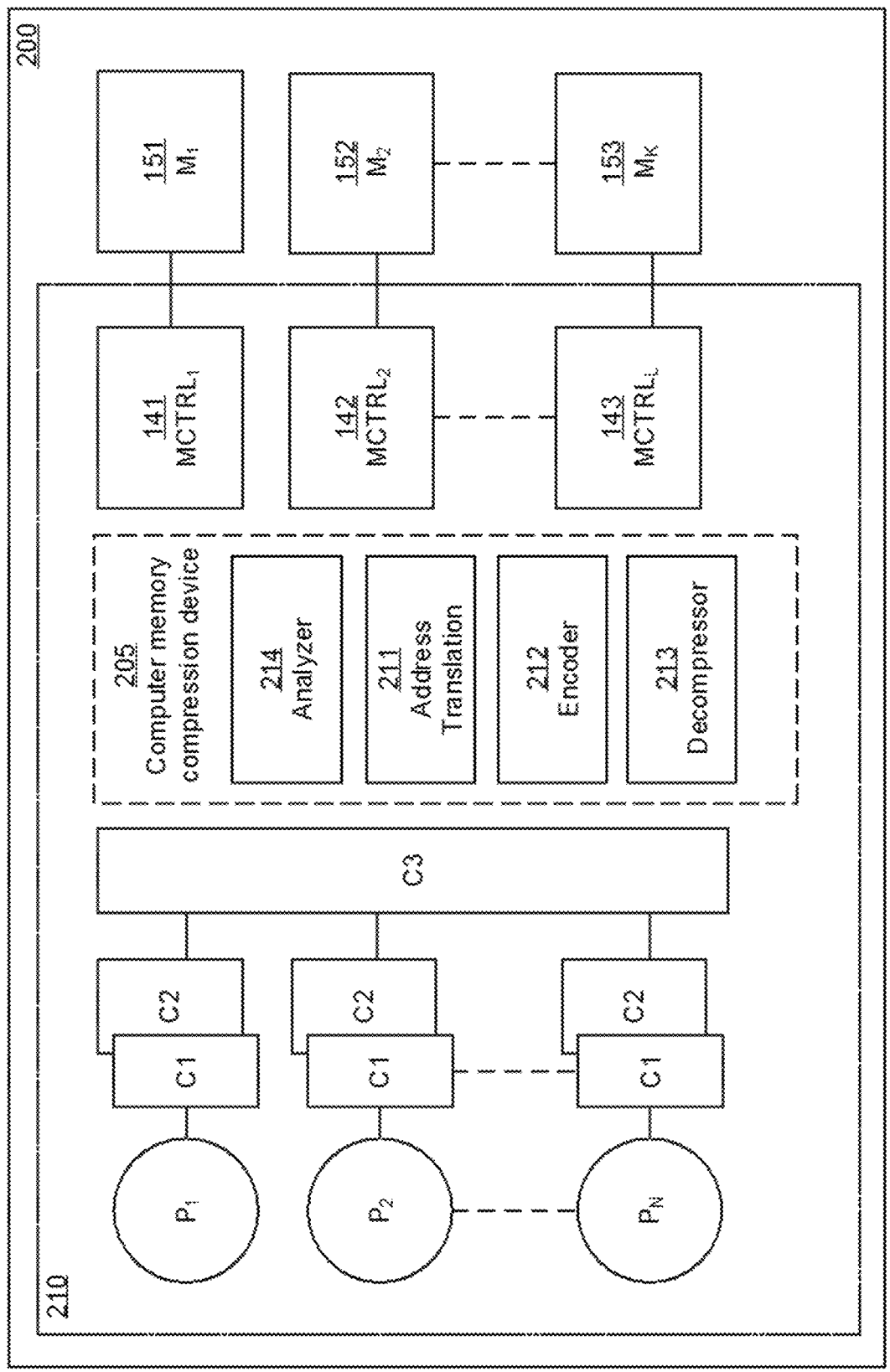
FIG. 2 depicts an exemplary computer system, such as in FIG. 1 configured for compressing data and instructions in memory.

As for the first disclosed embodiment, where we consider the problem of a limited main memory capacity, the exemplary system in FIG. 1 can be configured to allow data and instructions to be compressed in main memory. FIG. 2 shows an example of such a computer system 200. What has been added is a computer memory compression device 205 on the microprocessor chip 210. The computer memory compression device 205 comprises four functional blocks. These blocks comprise a locator (address translation) unit 211, an encoder (compressor) unit 212, a decoder (decompressor) unit 213 and an analyzer unit 214.

As will be explained in more detail below, the analyzer unit 214 is configured for analyzing computer memory content with respect to establishing global base values for compact encoding of data values in a plurality of data blocks in a memory object of data in computer memory, for example, a page comprising a plurality of data blocks. In these regards, the data values will typically be of finer granularity than the memory object, and the memory object will typically be of finer granularity than the entire computer memory content. A memory object may typically comprise a plurality of data blocks and a data block may typically comprise a plurality of data values, such as memory words (a.k.a. data words) being of type integer or floating-point values or any other type.

The encoder unit 212 is configured for encoding all data blocks of a memory object by creating the delta values with respect to a set of global bases and optionally also encoding the delta values using an entropy-based compression method. The encoder unit 212 is further configured for providing metadata representing the data blocks of a memory object of the encoded computer memory content. The metadata reflects how the delta values have been encoded by a reference to the global base values that have been used for each and every data value. Examples of such metadata are, for instance, seen in boxes 860 and 870 in FIG. 8. The locator unit 211 is configured for locating a memory object in the encoded computer memory content using the metadata.

The computer memory compression device 205 is connected to the memory controllers on one side and the last-level cache C3 on the other side. A purpose of the address translation unit 211 is to translate a conventional physical address PA to a compressed address CA to locate a memory block in the compressed memory. Someone skilled in the art realizes that such address translation is needed because a conventional memory page (say 4 KB) may be compressed to any size less than the size of a conventional memory page in a compressed memory. A purpose of the encoder (compressor) unit 212 is to compress memory blocks that have been modified and are evicted from the last-level cache. To have a negligible impact on the performance of the memory system, compression must be fast and is typically accelerated by a dedicated compressor unit. Similarly, when a memory block is requested by the processor and is not available in any of the cache levels, e.g. C1, C2 and C3 in the exemplary embodiment, the memory block must be requested from memory. The address translation unit 211 will locate the block but before it is installed in the cache hierarchy, e.g. in C1, it must be decompressed. A purpose of the decompressor unit 213 is to accelerate this process so that it can have negligible impact on the performance of the memory system.

Analyzing Memory Content to Select Global Base Values

Figure 3:
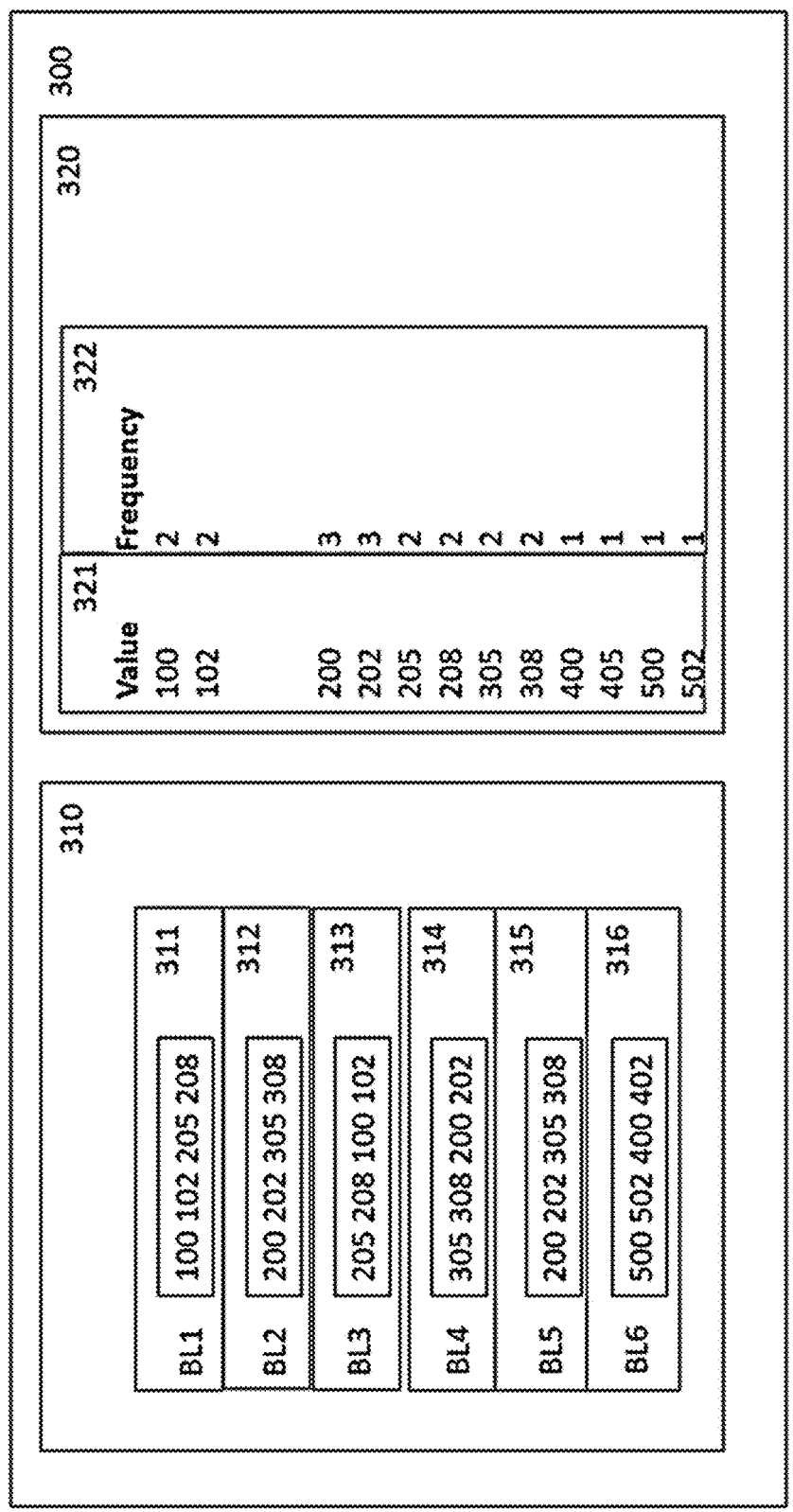
FIG. 3 depicts an exemplary memory page comprising a set of data blocks and the values therein.

FIG. 3 shows an exemplary snapshot of a portion of the memory and the values contained therein. 310 shows six exemplary data blocks BL1, BL2, BL6 (311, 312, . . . , 316) and the values they contain. For example, whereas data block 311 (BL1) contains the values 100, 102, 205 and 208, data block 313 (BL3) contains the values 205, 208, 100, and 102. 320 shows a histogram of the frequency of each value contained in the exemplary data blocks of 310 with the values that occur in column 321 and the number of times they occur, i.e., the frequency, in column 322. It can be seen that whereas value 200 occurs three times in BL2 312, BL4 314 and BL5 315, value 400 only occurs once in BL6 316.

Figure 4:
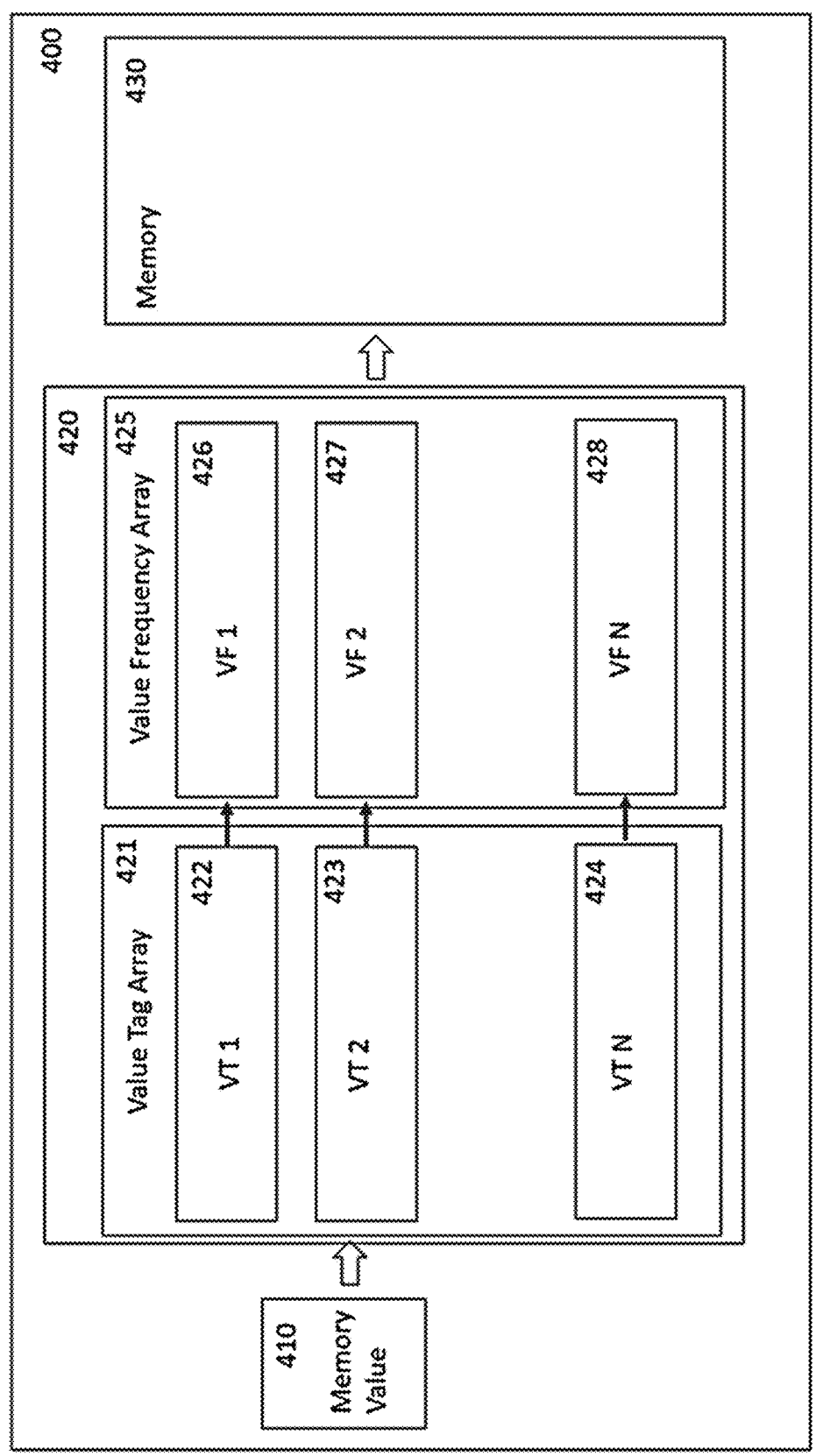
FIG. 4 depicts an analyzer configured to establish global values among values in a plurality of data blocks.

FIG. 4 depicts a device 420 configured to establish a histogram of the frequency of each value, or a subset of values in a portion of the memory, for example a page. This can be a part of the Analyzer 214 of FIG. 2. Device 420 comprises a Value Tag Array 421 and a Value Frequency Array 425. The portion of the memory to be analyzed with respect to the frequency of occurrence of each value in that portion can be scanned. This can be done by, for example, having a processor that reads from all or a subset of the locations in that portion or a device configured to scan through all or a subset of all values in the portion of the memory. Each value in the portion of memory being analyzed can be placed in register 410, denoted Memory Value. The register can be used to index into device 420 which in this embodiment is organized as a cache.

The exemplary cache-like structure comprises N entries, where each entry comprises a Value-Tag-Array entry, for example 423 (VT 2) and a Value-Frequency-Array entry, for example 427 (VF 2). Someone skilled in the art realizes that the cache can be configured to be direct-mapped, i.e., there is a one-to-one correspondence between a memory value contained in the Memory-Value register 410 and an entry in the device 420.

Alternatively, the cache can be configured to be set-associative, i.e. there is a one-to-many correspondence between a memory value contained in the Memory-Value register 410 and an entry in the device 420. Regardless, a memory value contained in register 410 can index the device 420. If the tag bits in the memory value of register 410 matches one, in case of direct-mapped configuration, or any entry in 420, in case of set-associative configuration, there is a hit in 420. In case of a hit, the corresponding Value-Frequency-Array entry will be incremented. By way of example, let's suppose that entry 423 (VT 2) matches the memory value of register 410. Then 427 (VF 2) is selected. If VF 2 contains 15, it will be incremented to 16. In case the memory value of register 410 is not contained in the device 420, an entry will have to be created. In case of a direct-mapped configuration, the value residing in the entry chosen is replaced. In case of a set-associative configuration, there can be a plurality of entries to select among for replacement. While someone skilled in the art realizes that one can choose among many replacement policies, for instance Least-Recently-Used (LRU) or First-In-First-Out (FIFO), specific to this device is a disclosed policy called Least-Frequent-Value, i.e., the entry with the lowest count in the Value Frequency Array 425 is selected for replacement.

When all intended values in the portion of memory have been scanned, device 420 contains an estimation of the value-frequency histogram 320 in FIG. 3. In one embodiment, device 420 is configured so that individual entries, e.g. entry 422 (VT 1) in conjunction with entry 426 (VF 1), can be read by computer instructions that access memory, that is, load and store instructions. This opens up a possibility to move the content from Device 420 to memory 430. As can be seen in FIG. 2, the device 420 can be part of the Analyzer 214 which is connected to any of the memory devices 151 (M1), 152 (M2) or 153 (M3) via memory controllers 141 (MCTRL1), 142 (MCTRL2) or 143 (MCTRL3).

Let us now describe how the value frequency histogram established by device 420 can be used to select a number of base values to minimize the delta values of all of the values contained in the portion of memory, called a memory object, for example a page, that has been analyzed.

Figure 5:
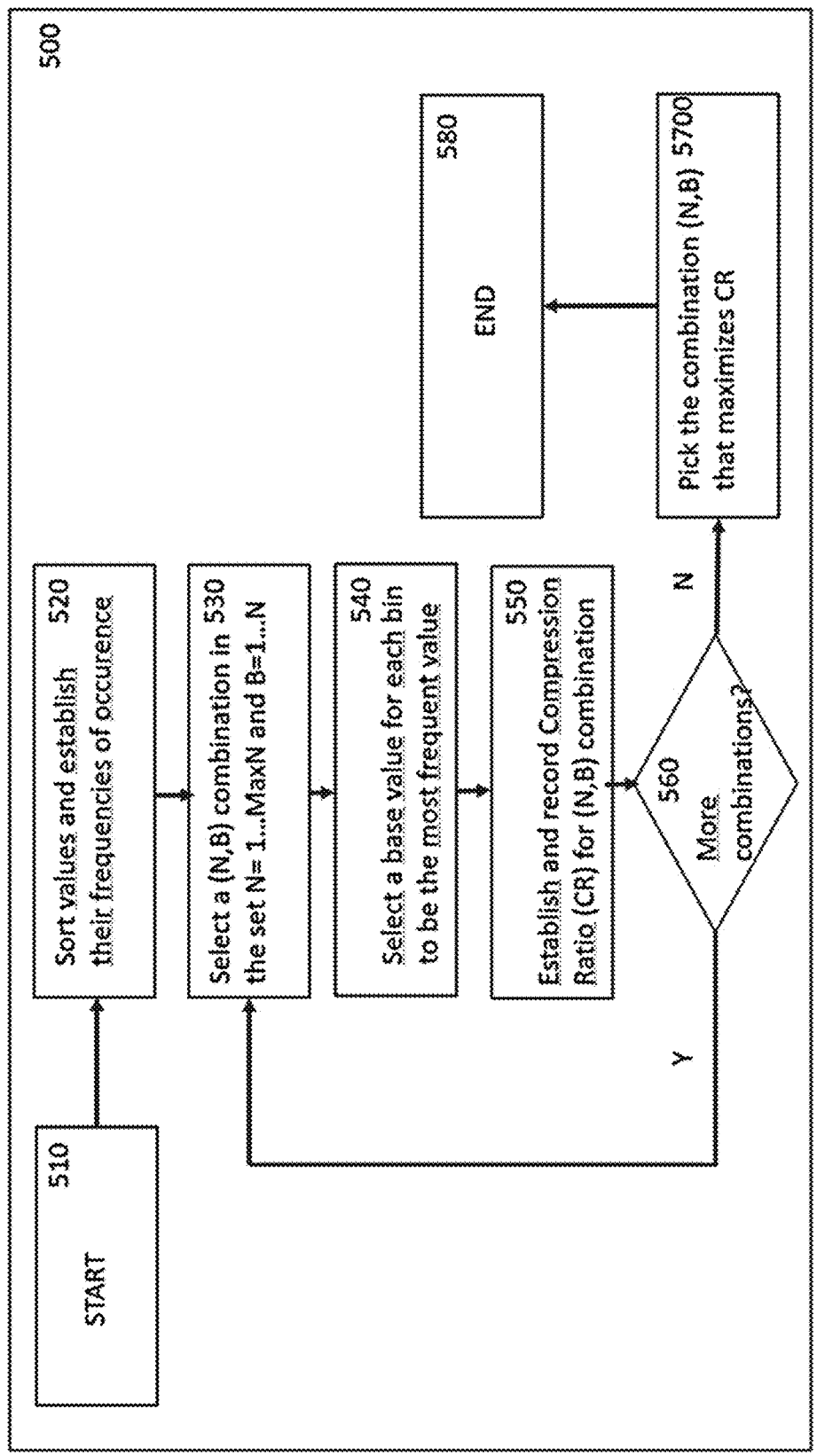
FIG. 5 depicts a method to establish global base values among data values in a plurality of data blocks.

FIG. 5 depicts a method to establish global base values among data values in a plurality of data blocks. It is assumed that the number of base values to be selected is B. The approach taken is to first divide the range of values that occur in the memory object into N fixed-sized bins. By means of example, assume that the values range from 1, 2, . . . , 100. If four bins are chosen, the range is divided into four bins: 1, 2, . . . , 25; 26, 27 . . . 50; 51, 52, . . . , 75; and 76, 77, . . . , 100.

The first step in the method 520 is to sort values from the lowest to the highest value along with their frequencies. The second step 530 is to establish how many bins N and how many global base values B to consider. To keep the number of base values to a reasonably low number, B is less or equal to N. By way of example, N could be chosen to be 4 and B could be chosen to be 4 yielding at most one global base value per bin. In this example, if the maximum N (MaxN) is 4 and the maximum B is N stated in box 530, all possible combinations of N and B, denoted (N,B), should be considered, that is, (N,B)=(1,1); (2,1); (2,2); (3,1); (3,2); (3,3); (4,1); (4,2); (4,3); (4,4). The second step 530 guarantees that all these combinations are considered.

The third step 540 considers one of a plurality of combinations (N,B) and establishes the global base value in each bin. Someone skilled in the art would select a clustering method known from prior art, e.g. k-means clustering. However, k-means selects a global value that minimizes the distance to all values in the cluster. This does not necessarily maximize the compression ratio. To realize that, consider a cluster of three values: 1, 1 and 7. K-means would select the base value as the average (1+1+7)/3=3. The distance between the base value and the first two values is 2 which needs two bits to encode in binary notation whereas the distance between the base value and the last value is 4 which needs three bits. Hence, in total, 2+2+3=7 bits are needed. If the first two values, which are the same, would be picked as the base value, the distance to them is zero and the distance to the third value is 6 which only needs 3 bits. By choosing one of the values as the base value, the compression ratio is higher than choosing the average of the values as said base value.

Accordingly, the third step 540 of the method first divides the value range into N bins. With B global base values, where B<=N, a base value is assigned to each of the B bins with the highest cumulative value frequency. Within each of said B bins, the base value is assigned the value of the highest frequency in that bin. The fourth step 550 compresses all data values in the memory object by using the closest base value to establish the delta value according to the method in FIG. 6 to be described later. The compression ratio, that is, the ratio of the sizes of the uncompressed memory object to the size of the compressed memory object, is established and recorded.

The fifth step 560 is to determine whether there are more combinations of the number of bins, N, and the number of global base values, B, to consider. If so, the next step will be to go back to the second step in the process 530. If not, the sixth step 570 will pick the combination of N bins and B global base values that yields the highest compression ratio and the process is then completed in 580.

Compressing and Decompressing Memory Content Using Global Base Values

We now consider a method for how to compress a data block using a set of global base values established, for example, using the method described in conjunction with FIG. 5. The process starts in 610. To this end, the method depicted in FIG. 6 considers a plurality of data elements in a memory object, say a page, or in a data block and the values they represent by considering a first value in the first step 620.

The global base-values are assumed to be stored in a table, referred to as a global base-value table. Each entry in said table is associated with an index. For example, if said table has N entries, the index can be represented by log 2N bits. The second step 630 of the method compares the selected value with all of the global base values in the global base-value table and selects the base value that is numerically closest to said data value, that is, the difference, denoted delta value, between that base value and said data value is minimal.

Figure 8:
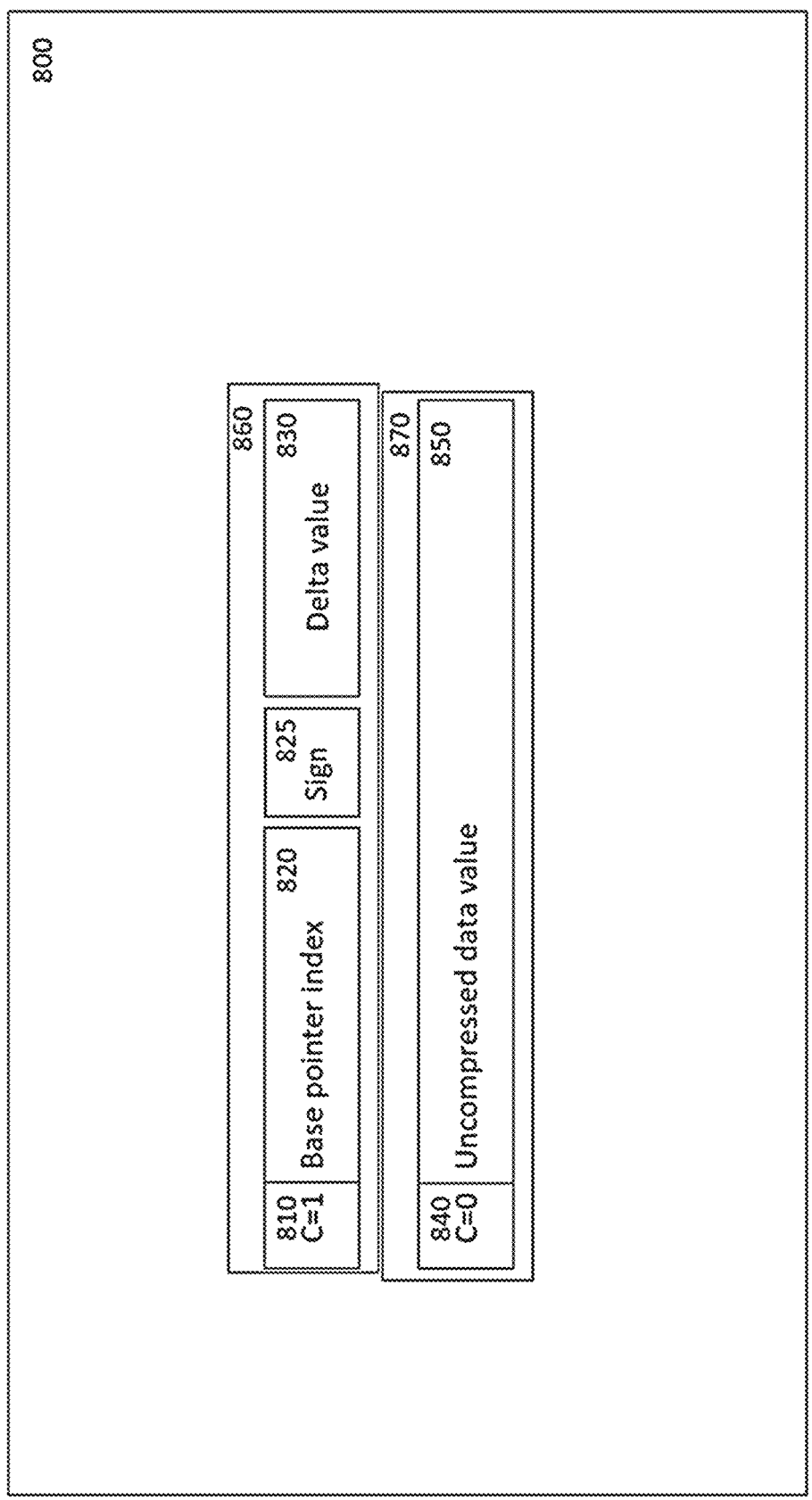
FIG. 8 depicts a metadata format to encode a value with a global base value.

Said data value will be encoded by the base-value index and the delta value as shown by the metadata to encode data values with the disclosed method in FIG. 8. There are two metadata formats 860 and 870 corresponding to the case when the data value is compressed (860) and when it is not compressed (870). Considering a compressed block as in box 860, the first field 810 is a single bit, C, that signifies that the data value is compressed. Field 820 comprises the base-pointer index to be used to select the global base value in the global base-value table. The third field 825 (Sign), is a single bit comprising whether the next field is non-negative or not. Finally, 830, denoted delta value, comprises the delta value. Having an explicit sign bit makes it possible to interpret the delta value as the distance from the base value if it is non-negative or negative. This simplifies the proposed devices described later.

In the case the data value is not compressed, metadata format 870 is used. While all data could be compressed, we also consider embodiments that only compress data when the delta value is less than a preset threshold. If not, C 840 is cleared and the second field 850 will contain the uncompressed data value. Otherwise, C 840 is set.

Figure 6:
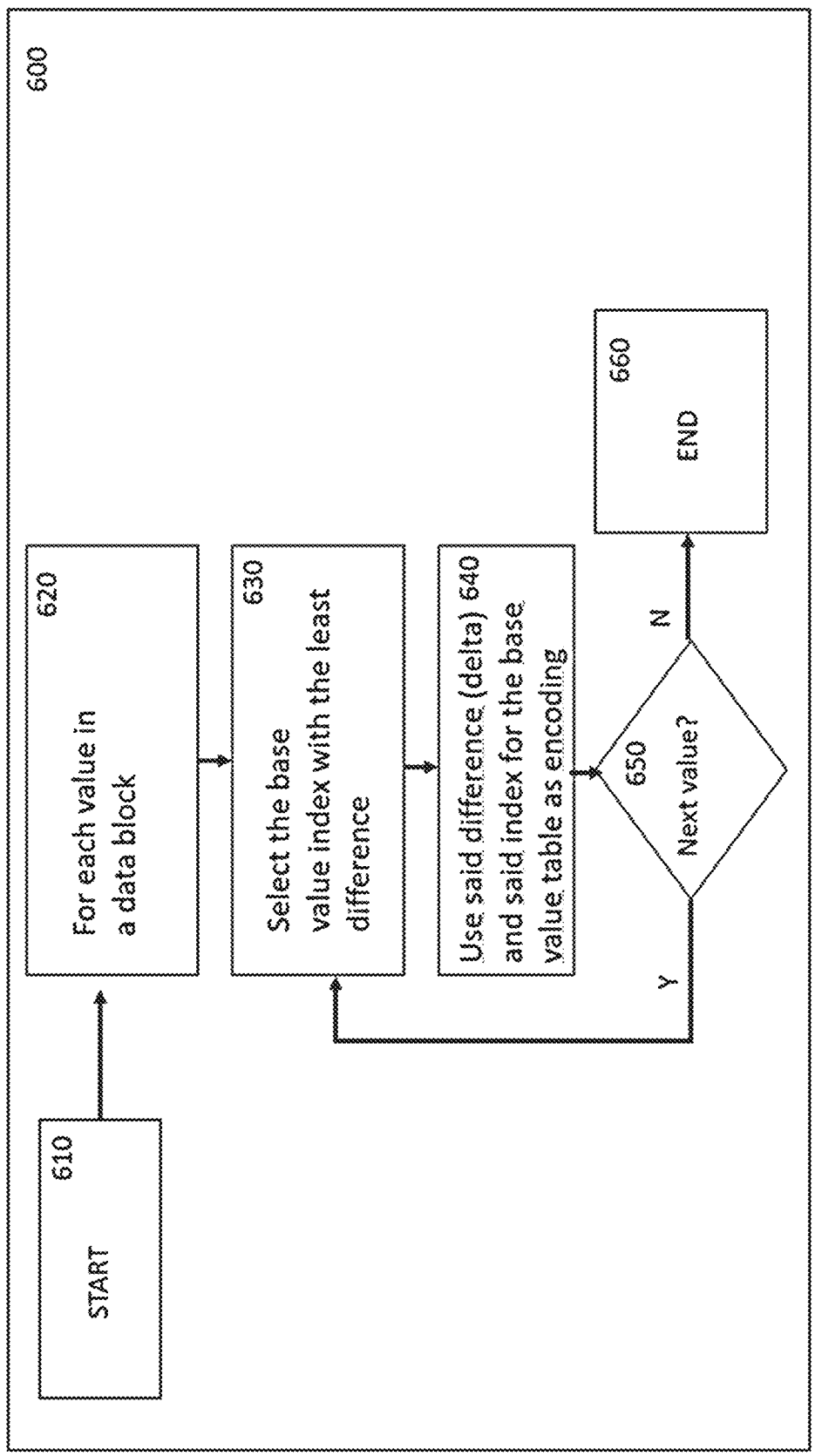
FIG. 6 depicts a method to compress a data block using a set of global base values.

Going back to FIG. 6 and the fourth step 650, if there are more data values to be considered in the memory object or data block, the next value will be considered, and the second step 630 will be selected. If there are no more data values to be considered, the method terminates in step 660.

In the embodiment of the method depicted in FIG. 6, a data value will always be encoded by a delta value by considering the closest base value. Allowing too large delta values may however lead to a lower compression ratio than if some of the data values were not compressed at all. In an alternative embodiment one may put a bound on the delta value, denoted upper bound delta value UB, and only compress a value if the corresponding delta value is less than or equal to said upper bound delta value. Values that are not compressed, because their delta values are greater than the upper bound delta value, are referred to as outlier values.

Figure 25:
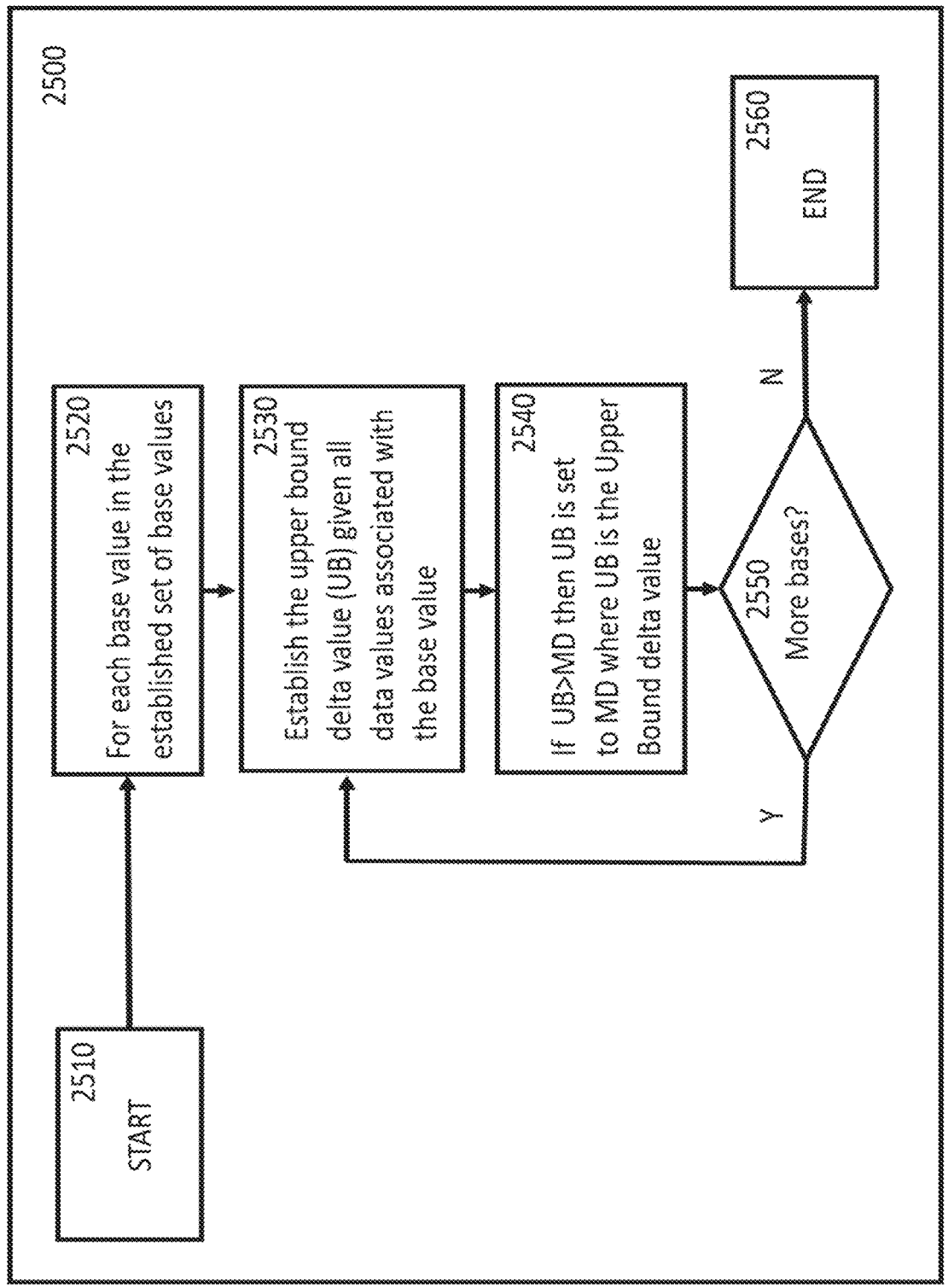
FIG. 25 depicts a method to compress a data block using a set of global base values with upper bounds on the delta value.

FIG. 25 depicts a method for selecting delta values in the presence of a maximum delta value, henceforth denoted MD, associated with each base value. The upper bound delta value UB is a threshold value which is less than or equal to a maximum delta value MD. Advantageously, the maximum delta value MD is defined by the largest binary number having n bits, wherein n=min_compressed_value_size−log2 (B). The min_compressed_value_size parameter is the minimum size, expressed in bits, of the encoded data values resulting from a given target compression ratio. B is the number of base values in the set of global base values. For instance, if the target compression ratio is 2 and with 32-bit data values, min_compressed_value_size will be 16 bits. By way of example, if B is 128 one would use $16-\log_2 128=9$ bits yielding $MD=2^9-1=511$. For a target compression ratio of 1.5 and still with 32-bit data values, min_compressed_value_size will be 21 bits. If the target compression ratio is 2 but the data values are 64-bit values, min_compressed_value_size will be 32 bits. These are merely non-limiting examples, as the skilled person will understand; other ways of defining the maximum delta value MD are possible.

The method depicted in FIG. 25 2500 starts in 2510 and assumes that the set of base values has been established for example by the method depicted in FIG. 6 for each base value in the set of base values 2520. All data values associated with that base value are considered to establish the upper-bound delta value (UB) being the largest delta value in the set of values associated with the base 2530. If UB, the maximum delta value, is greater than MD then UB is set to MD 2540. The process is repeated for each of the base values 2550 and terminates when all base values have been considered 2560.

Having established UB for each base value, a data value is encoded as the delta with respect to its closest base value if the delta value is less or equal to UB. Otherwise, the data value is not compressed.

Figure 7:
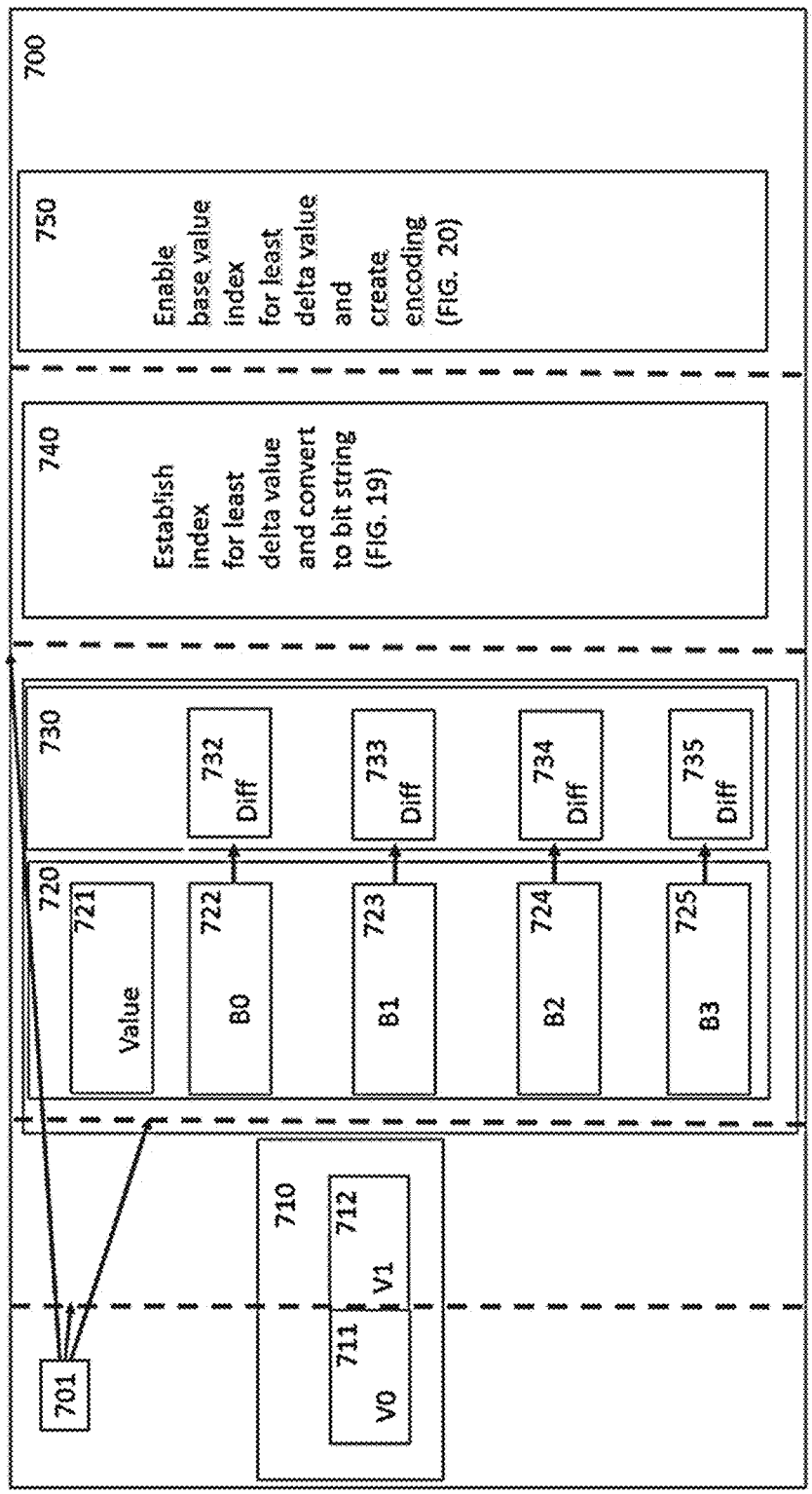
FIG. 7 depicts an encoder configured to compress a data block using a set of global base values.

Let us now pay attention to FIG. 7 which depicts an encoder 700 configured to compress a data block using a set of global base values according to the method described in conjunction with FIG. 6. By way of example, we consider two values 711 (V0) and 712 (V1) contained in a data block 710. This exemplary embodiment of a device 700 to encode data values comprises a global-base-value table 720 that has four entries 722, 723, 724 and 725 corresponding to B0, B1, B2 and B3, respectively. To select one among the global base values with a minimal difference to the value at hand, the global-base-value table 720 is configured to store the data value 721.

The global-base-value table is further configured so that the difference between any global-base-value entry and the data value 721 can be established. In one embodiment, this can be done in parallel in an associative manner by carrying out a subtraction between the global-base-value entry and the data value. The difference between a base value and the data value is stored in registers 732, 733, 734 and 735 where the differences between the data value 721 and the base value entry 722 (B0) is stored in 732 (Diff) and the difference between the data value 721 and the base value entry 724 (B2) is stored in 734 (Diff). Note that the delta value field 830 in FIG. 8 is interpreted as the distance from the base value, non-negative or negative.

Figure 19:
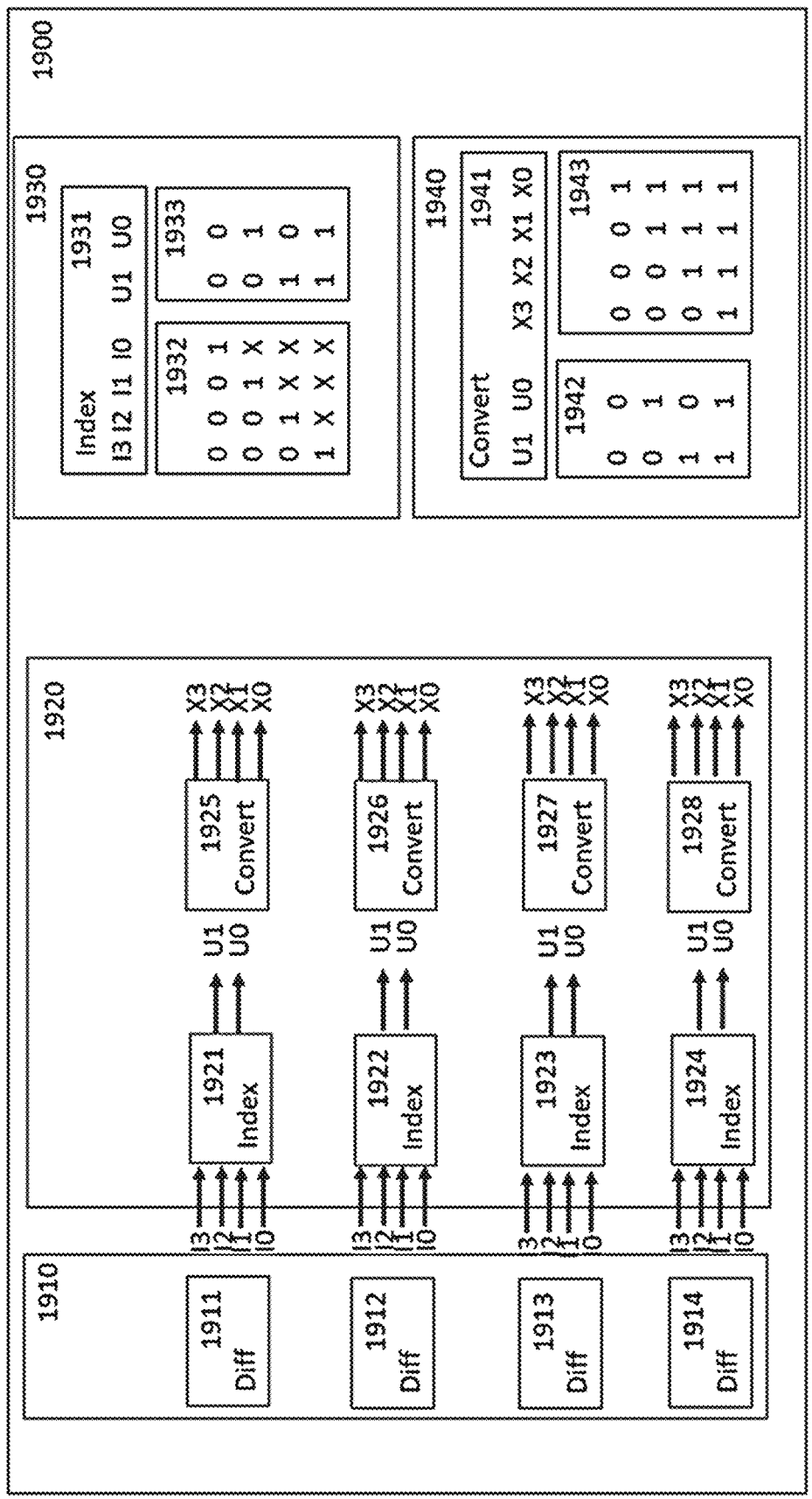
FIG. 19 depicts a device configured to represent the index of the most significant bit of the difference of delta values.
Figure 20:
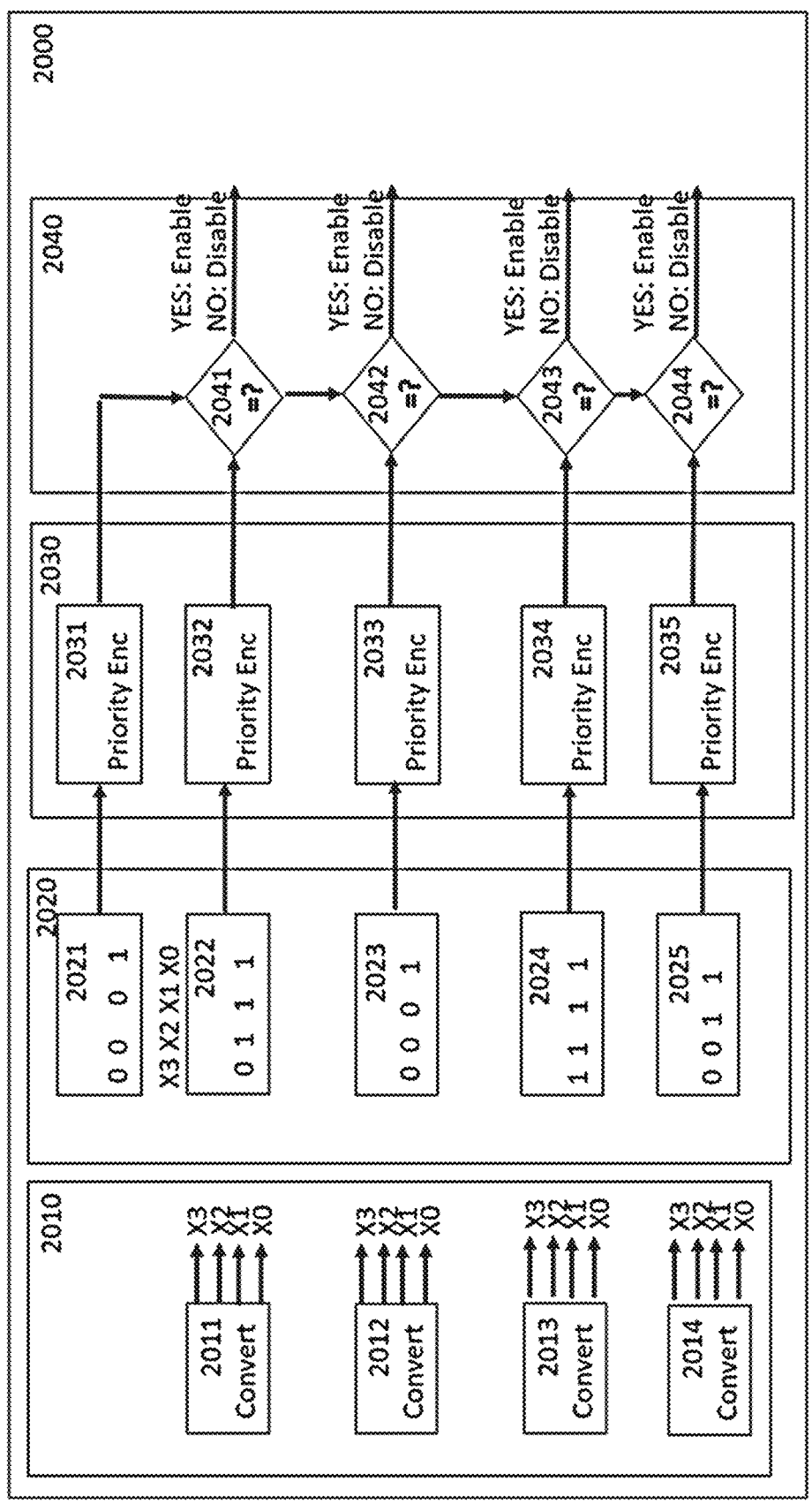
FIG. 20 depicts a device configured to enable the base value of the smallest delta value and encode the value.

The rest of the device, which is described in FIG. 19 and FIG. 20, is configured to use the plurality of differences to establish the smallest difference and select the base-value table entry corresponding to said difference.

Let us now turn our attention to FIG. 19. The plurality of registers 730 in FIG. 7 storing the differences are redrawn in FIG. 19 1910. In the exemplary embodiment, each Difference register 1911, 1912, 1913 and 1914 (Diff) comprises four bits denoted I3, I2, I1, and I0, where I0 is the least significant bit. The purpose of the Index blocks 1921, 1922, 1923 and 1924 is to establish which one is the most significant bit of the difference, i.e., the most significant bit that is non-zero. There are as many Index blocks as Difference registers. The truth table of the Index block is shown in 1930. For example, consider the third input vector in 1932 "01XX" where X stands for any binary value "0" or "1". Here, bit I2 is the most significant (non-zero) bit and will yield the output (U1,U0)=(1,0). As another example, in the first bit vector "0001", I0 is the most significant (non-zero) bit and will yield the output (U1,U0)=(0,0).

The index encoding of the most significant non-zero bit is now fed into another block Convert 1925, 1926, 1927 and 1928. The objective of Convert is to create a bit string that will be used to extract the smallest difference which will be described later. The truth table for the Convert block is shown in box 1940. It has as input 1941 the index encoding of the most significant bit from the Index block (U1, U0) and it has as output a bit string according to the truth table 1942 (input) and 1943 (output). For example, for the input (1,0), the output (X3, X2, X1, X0) is (0, 1, 1, 1). In general, the most significant bit pointed to by the index and all less significant bits are set to "1".

FIG. 20 shows the additional functionality needed to encode data values. The plurality of Convert functional blocks 1925, 1926, 1927 and 1928 in FIG. 19 are redrawn in FIG. 20 2011, 2012, 2013, 2014. 2020 comprises one register for each Convert block and will store the bit strings comprising the output from the Convert blocks. By way of example, register 2022, 2023, 2024 and 2025 contain the bit strings "0111", "0001", "1111" and "0011". The objective of 2020 is to establish the bit string with the smallest most significant bit, i.e., the first bit that is "1" counted from the most significant bit. This can be established by applying logical AND column-wise. For example, logical AND applied to all X3 bits will yield "0" whereas logical AND applied to X0 will yield "1". Hence, register 2021 will contain the bit string corresponding to the smallest difference after applying the column-wise logical AND operation.

The last step is to use register 2021 to establish the base-value-table entry that yields the smallest difference or delta. This is done in 2030 and 2040. 2030 comprises a plurality of priority encoders 2031, 2032, 2033, 2034 and 2035 applied to the bit strings established in 2020. The output of the priority encoders is the index of the bit position of the most significant bit in the difference or delta value. As an alternative to the priority encoders, one can use the output (U1,U0) from the Index blocks in 1920, for example block 1921. In 2040, all indexes are compared in parallel with the index of register 2021. The one index that is the same uniquely establishes which base-value entry yields the smallest difference and can be converted to an enable signal to retrieve that entry. This is depicted by the decision boxes 2041, 2042, 2043 and 2044. There can be a plurality of indexes that exhibit the same distance to the base value enabling the corresponding base-value entries. Then, one can choose the lowest or highest entry number of resorting to a random selection.

Someone skilled in the art knows that if the data value is the same as any base value, the priority decoder will fail to output a meaningful index value. One solution is to detect this case by a zero-comparator applied to the input signals (I3, I2, I1, I0) to the Index blocks 1921, 1922, 1923 and 1924 in FIG. 19. The output signal of said zero-comparators is then giving priority to the decision making in decision boxes 2041, 2042, 2043 and 2044 in FIG. 20. For example, if 2041 and 2042 establishes a match with the smallest index and 2043 reports a zero-comparison match, 2043 will win. Finally, if a plurality of entries reports a zero-comparison, the base-value register with the highest or lowest entry number or a random selection enables one base-value register.

Figure 26:
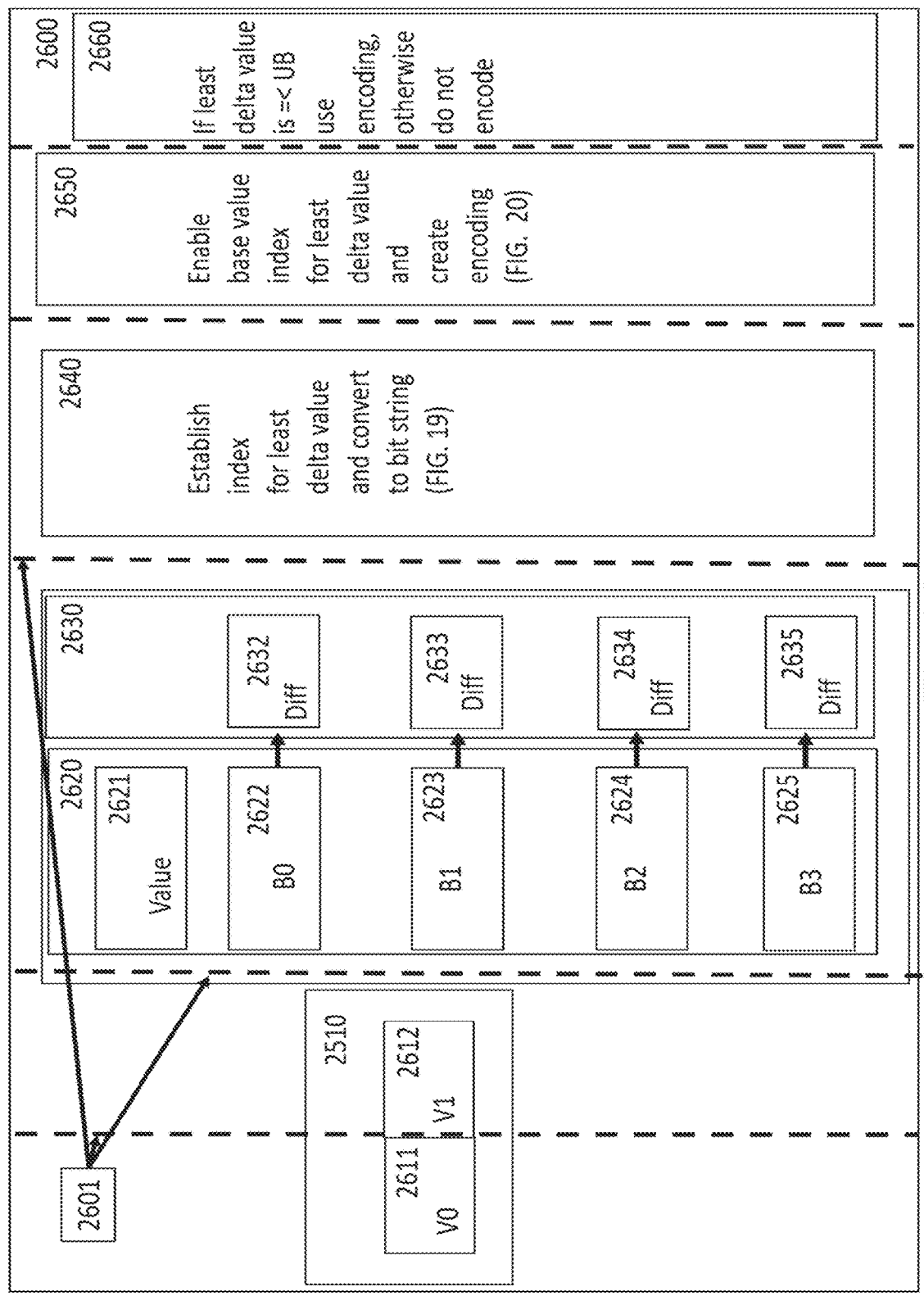
FIG. 26 depicts a device configured to encode a data block using a set of global base values with upper bounds on the delta value.

Let us now go back to the alternative method depicted in FIG. 25, where data values are encoded if and only if the delta value formed by the closest base value is less than or equal to the upper bound value. FIG. 26 depicts an encoder 2600 configured to compress a data block using a set of global base values according to the method described in conjunction with FIG. 25. It is adapted from the encoder configured to compress data values according to the method in FIG. 6. By way of example, we consider two values 2611 (V0) and 2612 (V1) contained in a data block 2610. This exemplary embodiment of a device 2600 to encode data values comprises a global-base-value table 2620 that has four entries 2622, 2623, 2624 and 2625 corresponding to B0, B1, B2 and B3, respectively. In contrast to only storing the base values, B0-B3 2622-2655, respectively, it also stores the upper bound delta values associated with each base value being established by the method depicted in FIG. 25. To select one among the global base values with a minimal difference to the value at hand, and its associated upper-bound value, the global-base-value table 2620 is configured to store the data value 2621.

The global-base-value table is further configured so that the difference between any global-base-value entry and the data value 2621 can be established. In one embodiment, this can be done in parallel in an associative manner by carrying out a subtraction between the global-base-value entry and the data value. The difference between a base value and the data value is stored in registers 2632, 2633, 2634 and 2635 where the differences between the data value 2621 and the base value entry 2622 (B0) is stored in 2632 (Diff) and the difference between the data value 2621 and the base value entry 2624 (B2) is stored in 2634 (Diff). Note that the delta value field 830 in FIG. 8 is interpreted as the distance from the base value, non-negative or negative.

The rest of the device, which is described in FIG. 19 and FIG. 20, described earlier, is configured to use the plurality of differences to establish the smallest difference and select the base-value table entry corresponding to said difference. The device in FIG. 26 will, as a last step, use the established base-value table entry and the difference for the encoding if the difference is less or equal to the upper bound value associated with the base value. This can be retrieved from any of the base value registers B0-B3 262 2-2625 corresponding to the selected base value. 2660 will finally compare the established difference with said upper bound value and only create an encoding if the difference is less or equal to said upper bound value.

Reference is now made back to the metadata layout 800 of FIG. 8. In case the data value will not be compressed, the C bit 840 will be cleared and the data value is uncompressed 850.

In another embodiment, it is desirable to encode values with a high throughput. To this end, example pipeline registers are placed between functional blocks and represented as dashed lines 701 to illustrate an example of such a pipelined device.

In alternative embodiments, one can further reduce the size of the delta values. It is advantageous to reserve a fixed amount of space for the delta value, say 16 bits. However, if delta values are typically small, the unused bits will be "0" (alternatively, "1" in two's complement representation). Going back to the metadata format in FIG. 8, the disclosed invention concatenates the base pointer index value with the delta value. One can reduce the size of the concatenated fields further by encoding the strikes of zeros (or ones) more compactly.

Figure 16:
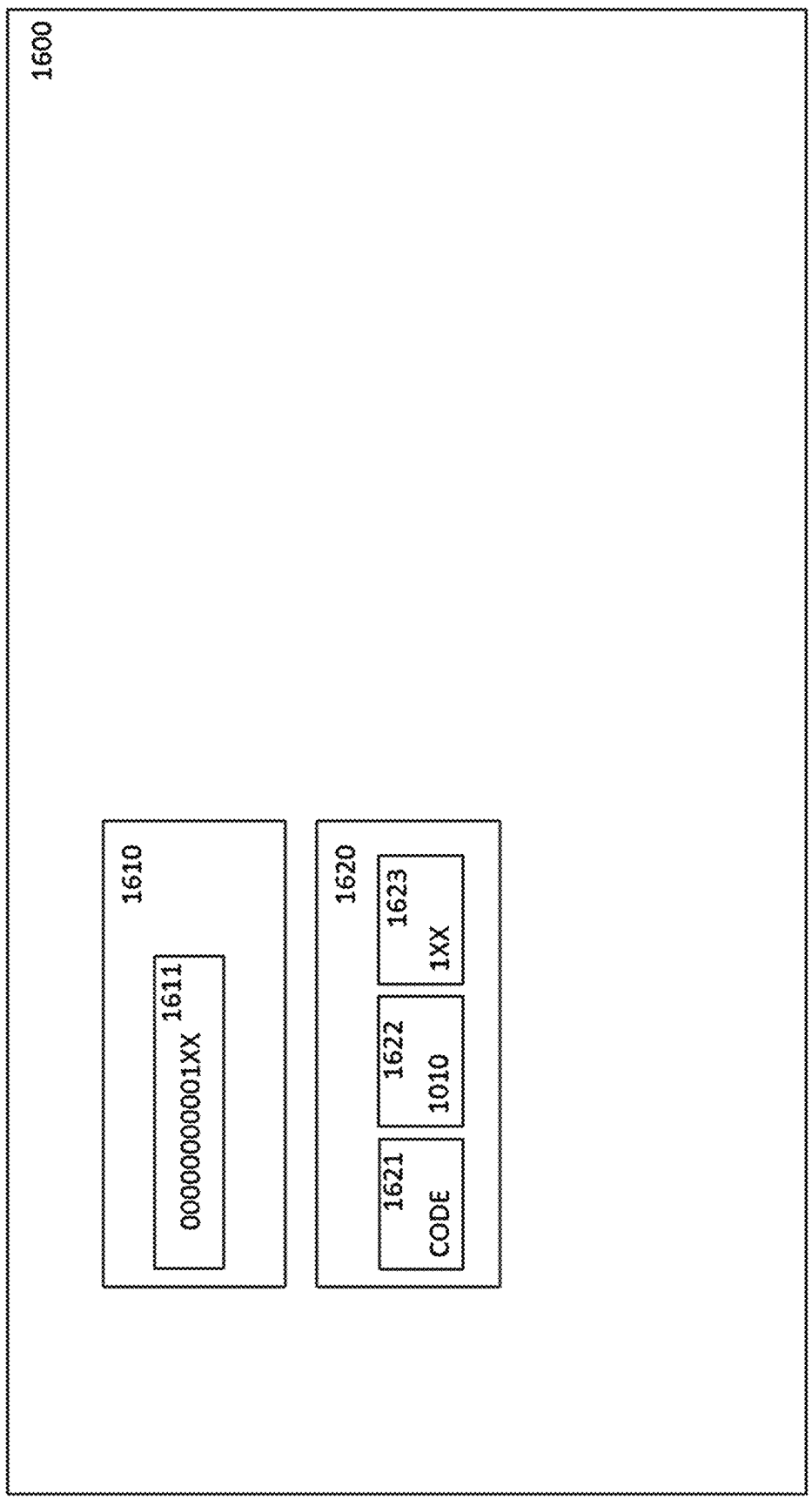
FIG. 16 depicts a metadata format to run-length encode the leading zeros or ones in a data value.

In one embodiment, the delta value field 830 of FIG. 8 can be encoded by counting the number of zeros from the most significant bit until the first non-zero bit (or alternatively, the number of ones from the most significant bit until the first bit that is zero, in two's complement representations). Such strikes of zeros or ones can be runlength encoded. For example, FIG. 16 shows a 13-bit delta value 1611 where the most significant ten bits are zero followed by one. The metadata format 1620 shows how the delta value has been encoded, using runlength encoding, with a code 1621 (CODE), to signify that runlength encoding is used, followed by the number of zeros (1010 in binary notation) 1622 followed by the nonzero part 1623.

In an alternative embodiment, if a plurality of nearby values has a large number of leading zeros (or ones), one can runlength encode the number of zeros by first considering the most significant bit of a plurality of values, then the second most significant bit etc. For example, FIG. 17 considers four exemplary values 1710, 1720, 1730 and 1740. The 20 most significant bits of the first value, 1710, are zero whereas the second 1720, third 1730 and fourth 1740 have the 19, 21 and 21 bits, respectively, most significant bits zero.

By examining a strike of zeros, column-wise across a plurality of values, starting with the most significant bit, then the next most significant bit, etc., for the four exemplary values, 1710, 1720, 1730 and 1740, the 19 most significant bits are zero. By runlength encoding said zeros, one can compress a plurality of delta values more effectively. This is known as bit-plane compression by someone skilled in the art. Combinations of such methods and devices with the methods and devices disclosed in this patent disclosure are also contemplated.

Figure 17:
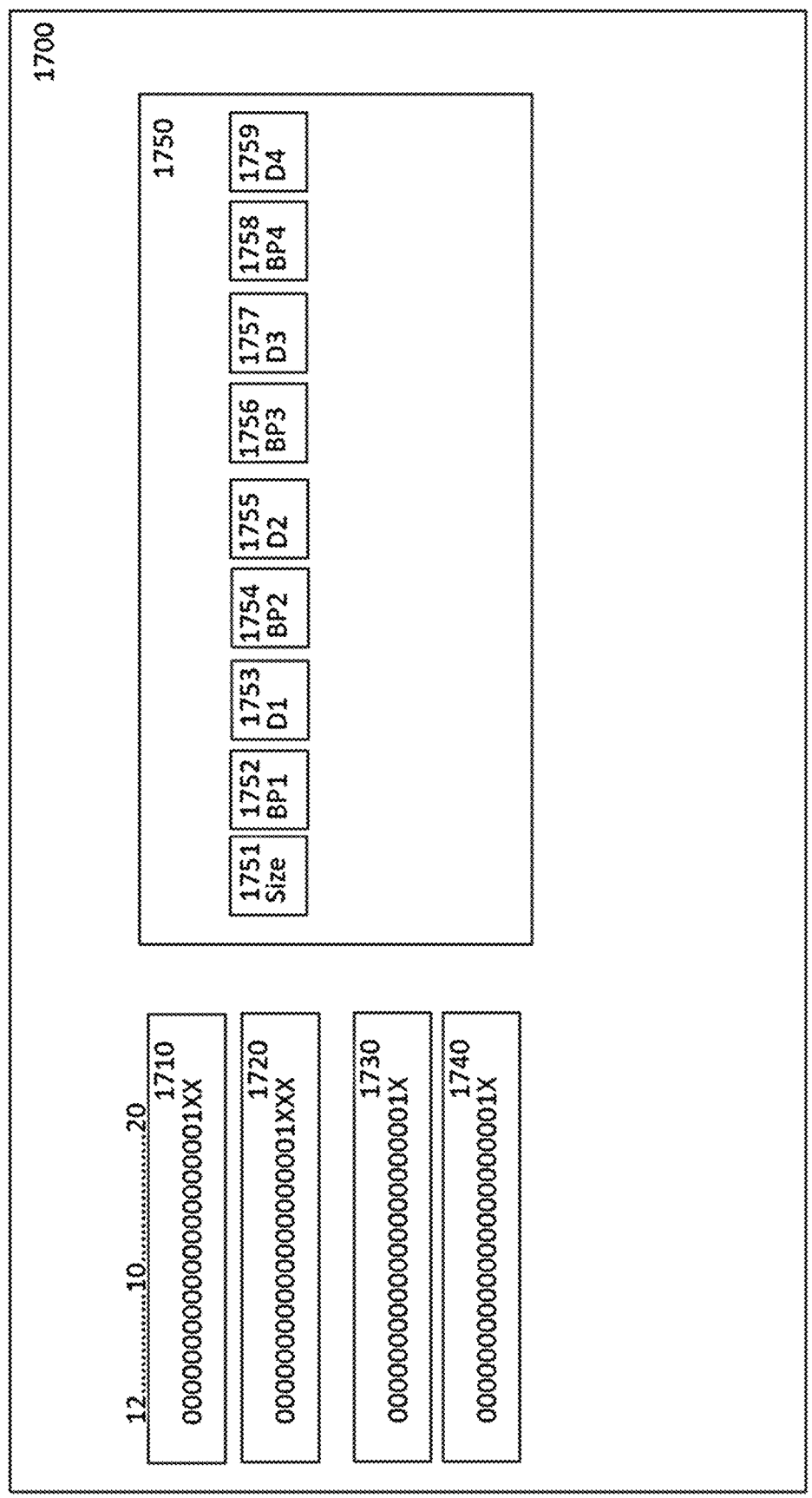
FIG. 17 depicts a procedure for run-length encoding the leading zeros or ones in a plurality of data values by applying bit-plane transformation.

FIG. 17 also shows an embodiment of a format for metadata 1750 when combining bit-plane compression with the disclosed delta encoding method employing global bases. Here, the metadata for an exemplary block of four values is shown. Size 1751 depicts the largest size of any delta value. It can be determined by counting the number of most significant bits that are zero in all values in a block by, for example, employing runlength encoding. The base values associated with each individual value are encoded in BP1 1752, BP2 1754, BP3 1756 and BP4 1758. Finally, the delta values associated with each individual value are encoded in D1 1753, D2 1755, D3 1757 and D4 1759. Other metadata formats are possible, for example, having a dedicated bit encoding whether the block is compressed or not as employed in the exemplary metadata format embodiment of FIG. 8.

We contemplate systems, methods and devices that are applicable broadly as a preparatory step before applying any compression method including delta compression as in this disclosure and beyond to entropy-based compression, deduplication-based compression or any compression method known by someone skilled in the art.

As one example, we consider the case when data values are floating-point numbers. In a family of lossy compression techniques considering floating-point numbers, it is known by someone skilled in the art that it can be advantageous to disregard the N least significant bits in the mantissa because the entropy in the mantissa is then reduced giving a higher compression ratio. A method and associated device configured to do that known from prior art simply truncates, that is, consider all N least significant bits as zero (or analogously one). In the case that most of the N zero bits are zero (or one), truncation will lead to a small error. However, truncation can lead to a significant error, especially if a majority of the N least significant bits are nonzero.

Figure 18:
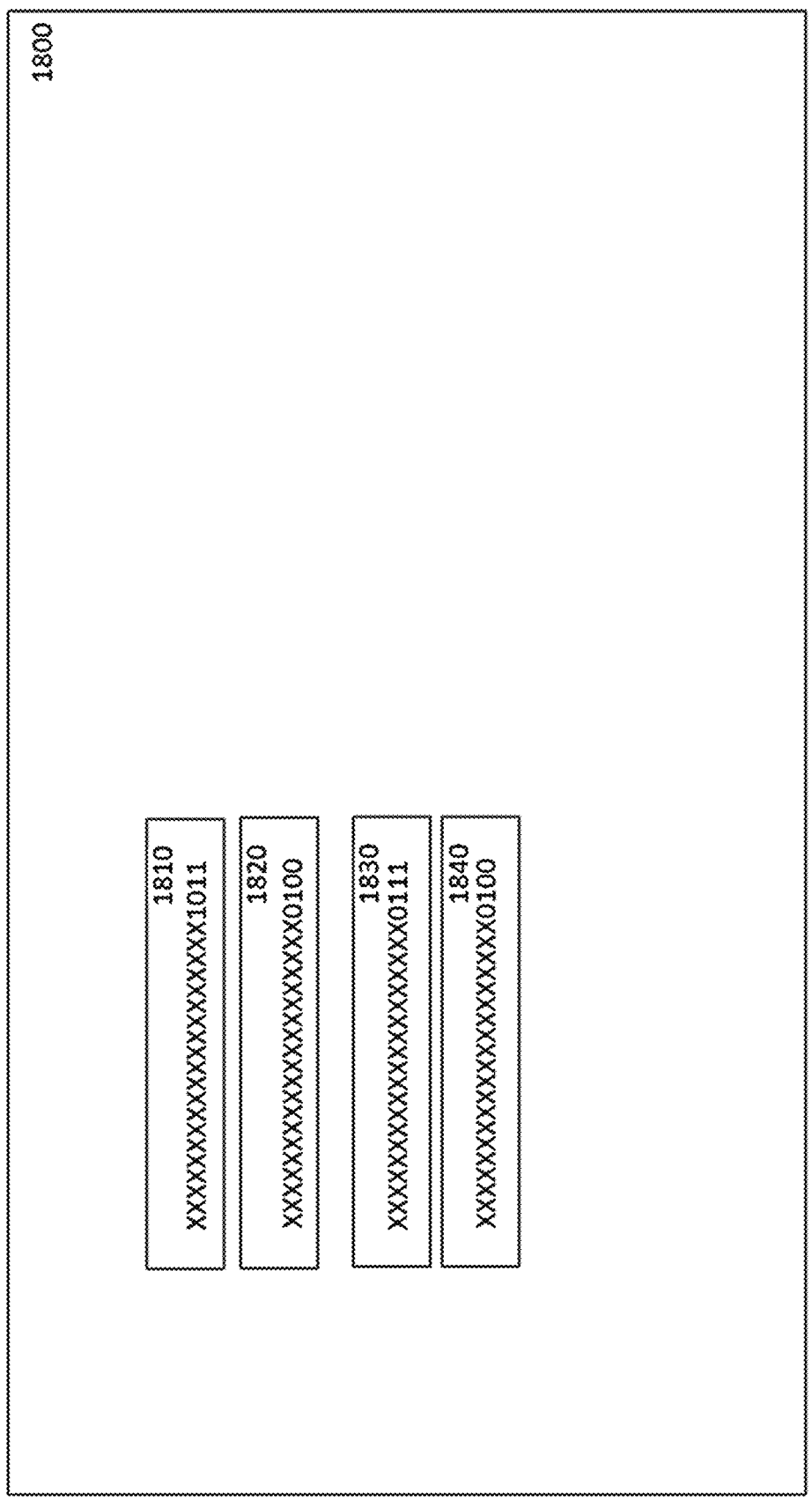
FIG. 18 depicts a procedure for replacing a plurality of least significant mantissa bits with the most common symbol to increase the accuracy.

For example, FIG. 18 shows the mantissa of four floating-point values 1810, 1820, 1830 and 1840. Each mantissa contains 24 bits. If N is selected to four, truncation of the four least significant bits will be zero. This will lead to a large error for the mantissas 1810 and 1830 where most of the four least significant bits are one.

One embodiment considers a method and a device configured to count the number of zeros in the least significant N bits. If zeros are in majority all N bits are represented as zeros. If, on the other hand, non-zeros are in majority, all N bits are represented as zeros. Finally, if there is a tie, the last N bits can be encoded as either one or zero. For example, the least significant bits of mantissas 1810 and 1830 will be represented by a single bit 1850 and 1870, respectively, set to "1" whereas the least significant bits will be represented by a single bit 1860 and 1880, respectively, set to "0". Additionally, with this technique we also contemplate any embodiment in combination with the techniques mentioned previously that apply runlength encoding to encode the delta values more compactly.

We now turn our attention to a method to decompress a data block compressed by encoding the difference to a set of global base values. Such a method is displayed in FIG. 9. The method applies to a data value encoded using the metadata in FIG. 8. In case the data value is compressed, metadata format 860 applies and field 810 will designate that the block is compressed by C=1 and field 820, 825 and 830 will comprise the base pointer index, the sign bit and the delta value, respectively. On the other hand, if the data value is not compressed, metadata format 870 applies and field 840 will designate that the data value is not compressed by C=0 and field 850 will comprise the uncompressed data value.

Figure 9:
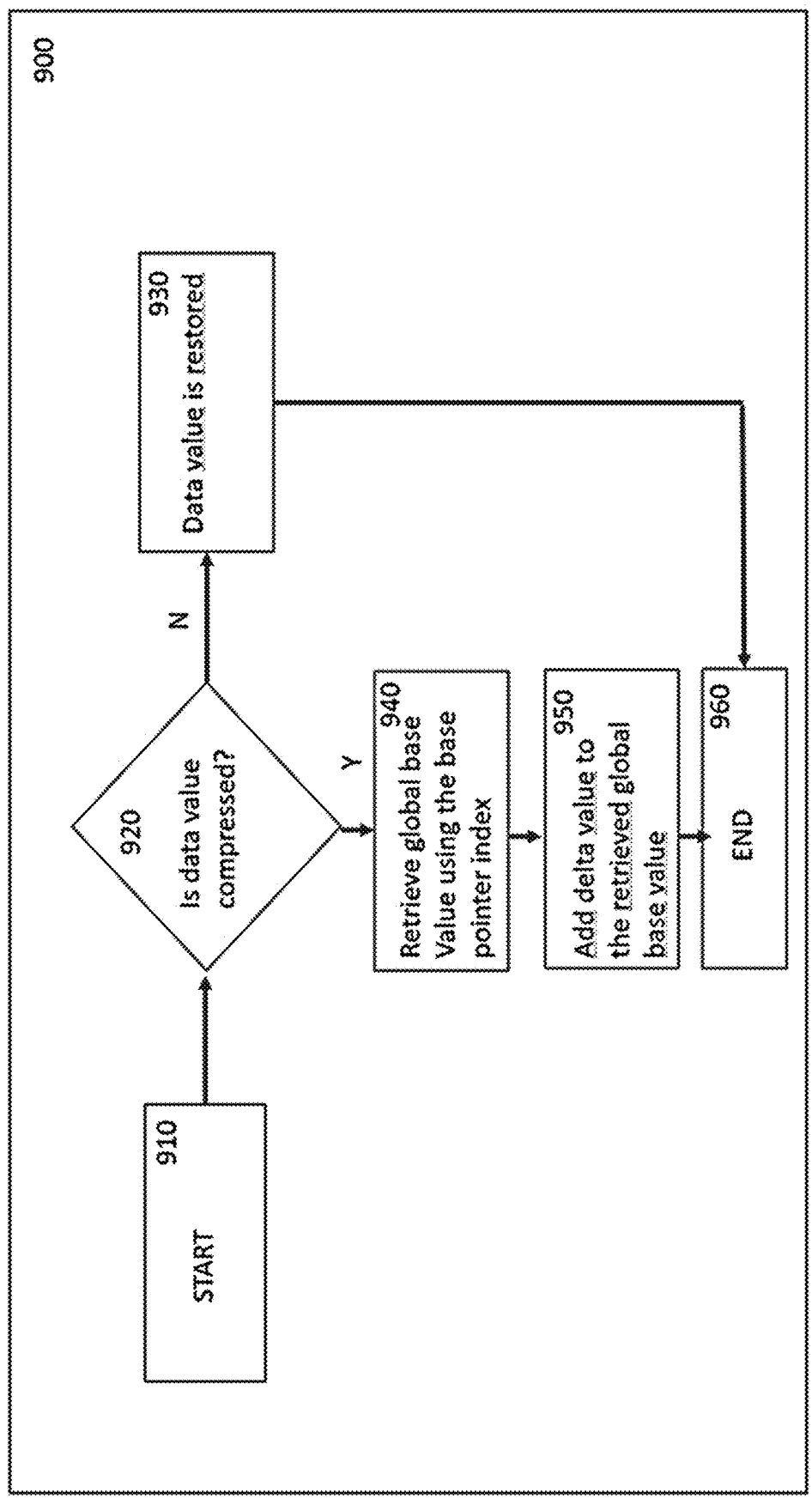
FIG. 9 depicts a method to decompress a data block using a set of global base values.

Going back to FIG. 9, the first step 920 in the process 900, will inspect the fields 810 and 840, C in FIG. 8. If the data value is not compressed, that is C=0, the next step will be 930 and the data value can be retrieved from field 850 in FIG. 8 after which the process terminates 960. In the case the data value is compressed, the next step in the process is 940. Here, the global base-value is retrieved by using field 820 in FIG. 8 to index into the global-base-value table. In the next step 940 in FIG. 9, the global base value 820 is added to the delta value 830 taking the sign bit 825 into account in FIG. 8 to restore the data value. Someone skilled in the art realizes that the process depicted in 900 can be repeated for as many data values contained in a memory object, say a page, or a data block.

Figure 10:
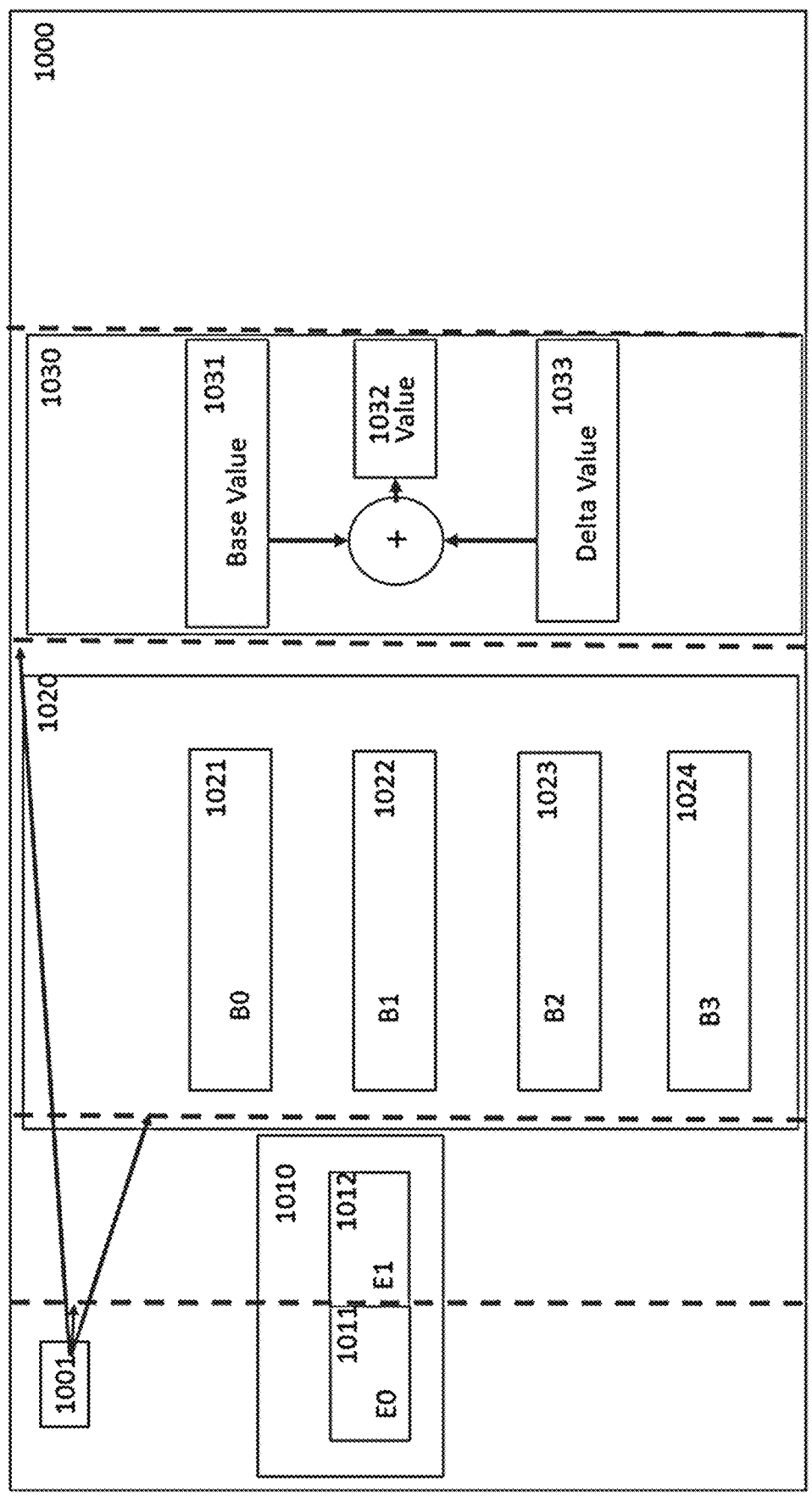
FIG. 10 depicts a device configured to decompress a data block using a set of global base values.

FIG. 10 depicts a device configured to decompress a data block using a set of global base-values according to the process of FIG. 9. The exemplary device 1000 uses as input a plurality of encodings according to the metadata fields in FIG. 8. In the exemplary device, according to drawing 1000, there are two encoded values 1011 (E0) and 1012 (E1). The base pointer index field 820 selects one of a plurality of the global-base-value entries. In the exemplary device 1000, there are four global-base-value entries 1021 (B0), 1022 (B2), 1023 (B3) and 1024 (B4). One of the entries is selected and the global base-pointer value in that entry is copied to base-value register 1031. The delta-value field 830 in FIG. 8 is copied to the delta-value register 1033. Next, the device is configured to add the base value 1031 to the delta value 1032. The sum is loaded into register 1032 in which the original value is retrieved.

In another embodiment, it is desirable to decode values with a high throughput. To this end, example pipeline registers are placed between functional blocks and represented as dashed lines 1001 to illustrate an example of such a pipelined device.

Compressing and Decompressing Delta Values Using Entropy-Based Coding Schemes

We now turn our attention to an embodiment that can offer higher compression degree than delta encoding using global bases. In one scenario, multiple data blocks may contain the exact same values. They can be encoded using the same global base value and can have the same delta values. However, even if they use different global base-values, they can still use the same delta value. The objective with the next patent disclosure is to encode more frequently occurring delta values with fewer bits than less frequently occurring delta values.

Figure 11:
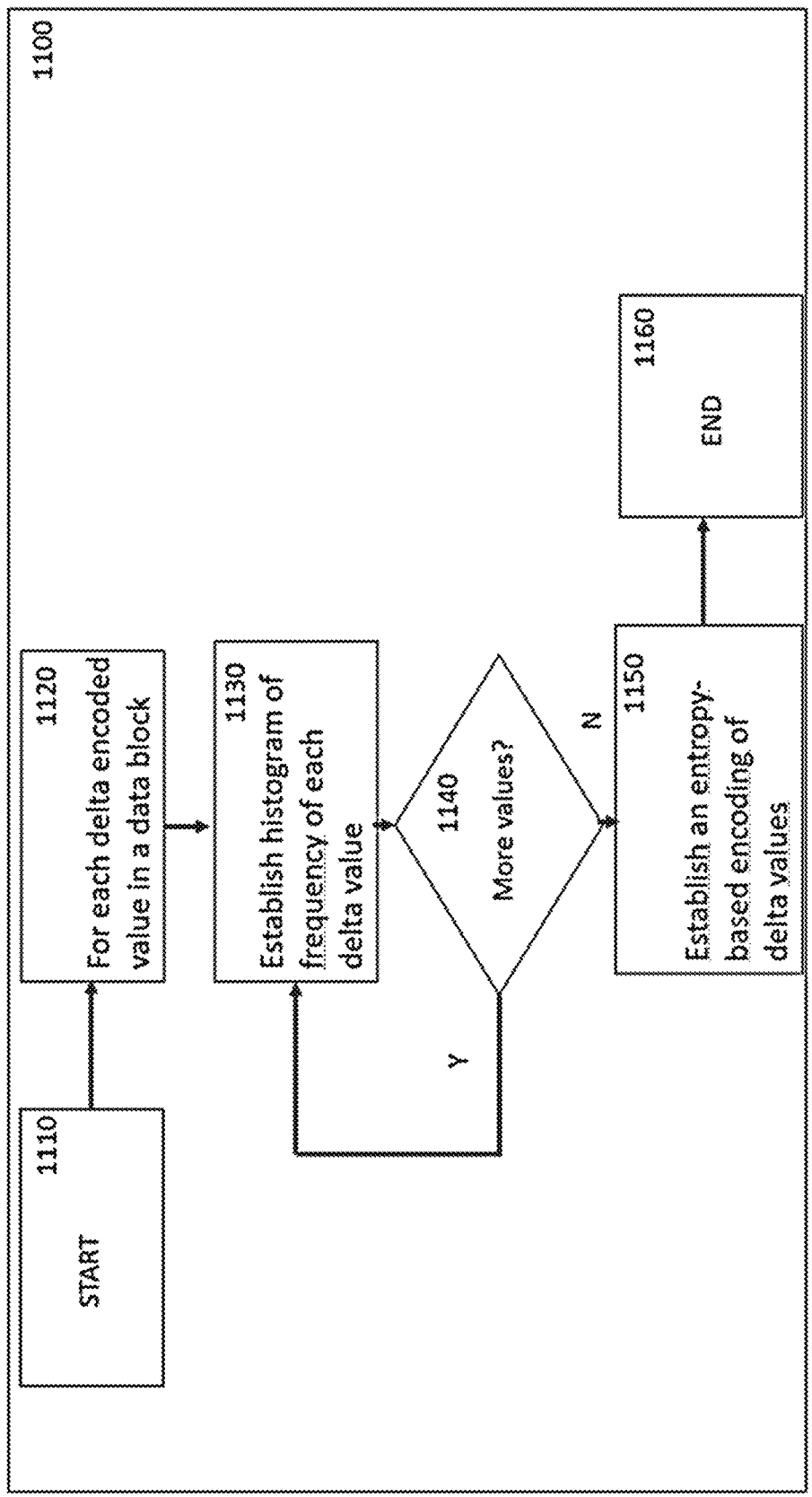
FIG. 11 depicts a method to encode delta values compactly using entropy-based encoding.

FIG. 11 depicts a method that can encode delta values compactly using entropy-based encoding. The process starts in box 1110. Consider a memory object or a data block in which individual values have been encoded using delta encoding with global base values according to the metadata shown in FIG. 8. In general, the objective of the method is to first establish a histogram of the frequency of the delta values of a plurality of encoded values in the memory object or a data block. To this end, 1120 initiates the process and in the second step, 1130, the number of occurrences of a first delta value is incremented. This process is repeated, in step 1140, for as long as not all delta values have been considered. When all delta values have been considered, the process continues to step 1150 in which the objective is to establish an entropy-based encoding of delta values. Someone skilled in the art realizes that there is a plurality of methods to choose between such as Huffman coding and arithmetic coding. Common to such entropy-based encoding techniques is that they need histogram information about the relative frequency of each symbol, which in this case can be the delta value.

Figure 12:
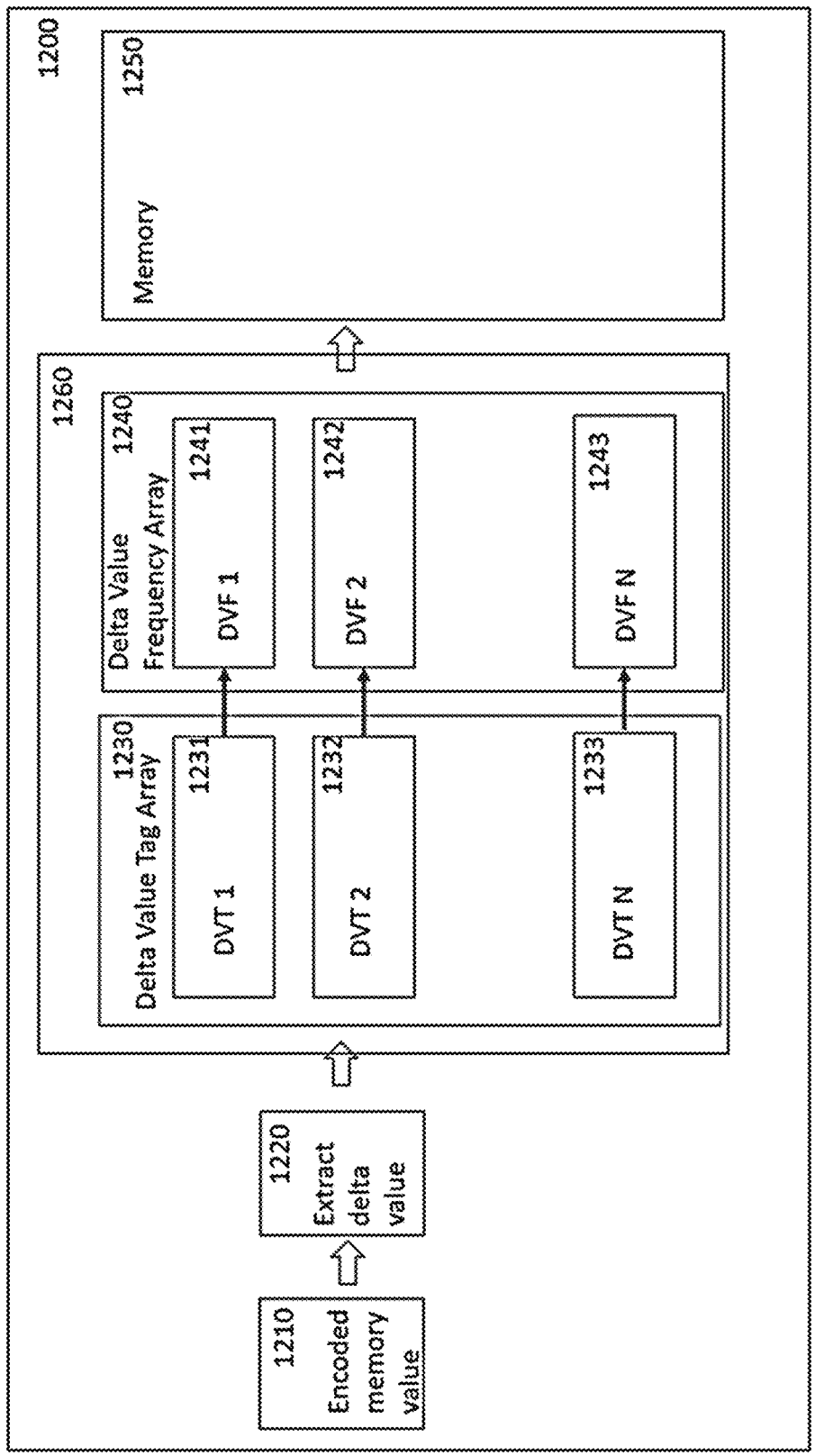
FIG. 12 depicts a device configured to encode delta values using entropy-based encoding.

FIG. 12 depicts a device configured to encode delta values using entropy-based encoding to support the method described in FIG. 11. Each delta encoded data value, according to the metadata in FIG. 8, is loaded into register 1210 (Encoded memory value). It is assumed that a computer can access this register with load and store instructions. The delta value field 830 in FIG. 8 is next extracted and copied into register 1220. Device 1260 is one of many embodiments configured to count the frequency, that is the number of occurrences, of each delta value. Register 1220 can index into device 1260 which is organized as a cache. The exemplary cache-like structure comprises N entries where each entry comprises a Delta-Value-Tag-Array entry, for example 1232 (DVT 2) and a Delta-Value-Frequency-Array entry, for example 1242 (DVF 2). Someone skilled in the art realizes that the cache can be configured to be direct-mapped, i.e., there is a one-to-one correspondence between a memory (data) value contained in the Delta-Value register 1220 and an entry in the device 1260.

Alternatively, the cache can be configured to be set-associative, i.e. there is a one-to-many correspondence between a memory (data) value contained in the Delta-Value register 1220 and an entry in the device 1260. Regardless, a delta value contained in register 1220 will index the device 1260. If the tag bits in the memory value of register 1220 matches one (in case of direct-mapped configuration) or one out of a plurality of entries (in case of set-associative configuration) in 1260, there is a hit in 1260. In case of a hit, the corresponding delta-value-frequency-array entry will be incremented. By way of example, let's suppose that entry 1232 (DVT 2) matches the delta value of register 1220. Then 1242 (DVF 2) is selected. If DVF 2 contains 15, it will be incremented to 16. In case the delta value of register 1220 is not contained in the device 1260, an entry will have to be created.

In case of a direct-mapped configuration, the value residing in the entry chosen is replaced. In case of a set-associative configuration, there is a plurality of entries to select from for replacement. While someone skilled in the art realizes that one can choose among many, for instance Least-Recently-Used (LRU) or First-In-First-Out (FIFO) replacement schemes, specific to this device is a policy called Least-Frequently-Delta-Value-Used, i.e., the entry with the lowest count in the Delta Value Frequency Array 1240 is selected.

When all values in the memory object have been scanned, device 1260 contains an estimation of delta value frequency. Device 1260 can be configured so that individual entries, e.g. entry 1231 (DVT 1) in conjunction with entry 1241 (DVF 1), can be read by computer instructions through so called load instructions. This opens a possibility to move the content from the device 1260 to memory 1250. As can be seen in FIG. 2, the device 420 can be part of the Analyzer 214 which is connected to any of the memory devices 151 (M1), 152 (M2) or 153 (M3) via memory controllers 141 (MCTRL1), 142 (MCTRL2) or 143 (MC TRL3).

When the delta value frequency information has been copied to memory, one can analyze it further and generate encodings using any entropy-based encoding scheme known from prior art such as Huffman coding or arithmetic coding. Additionally, one can apply deduplication-based compression techniques.

Figure 13:
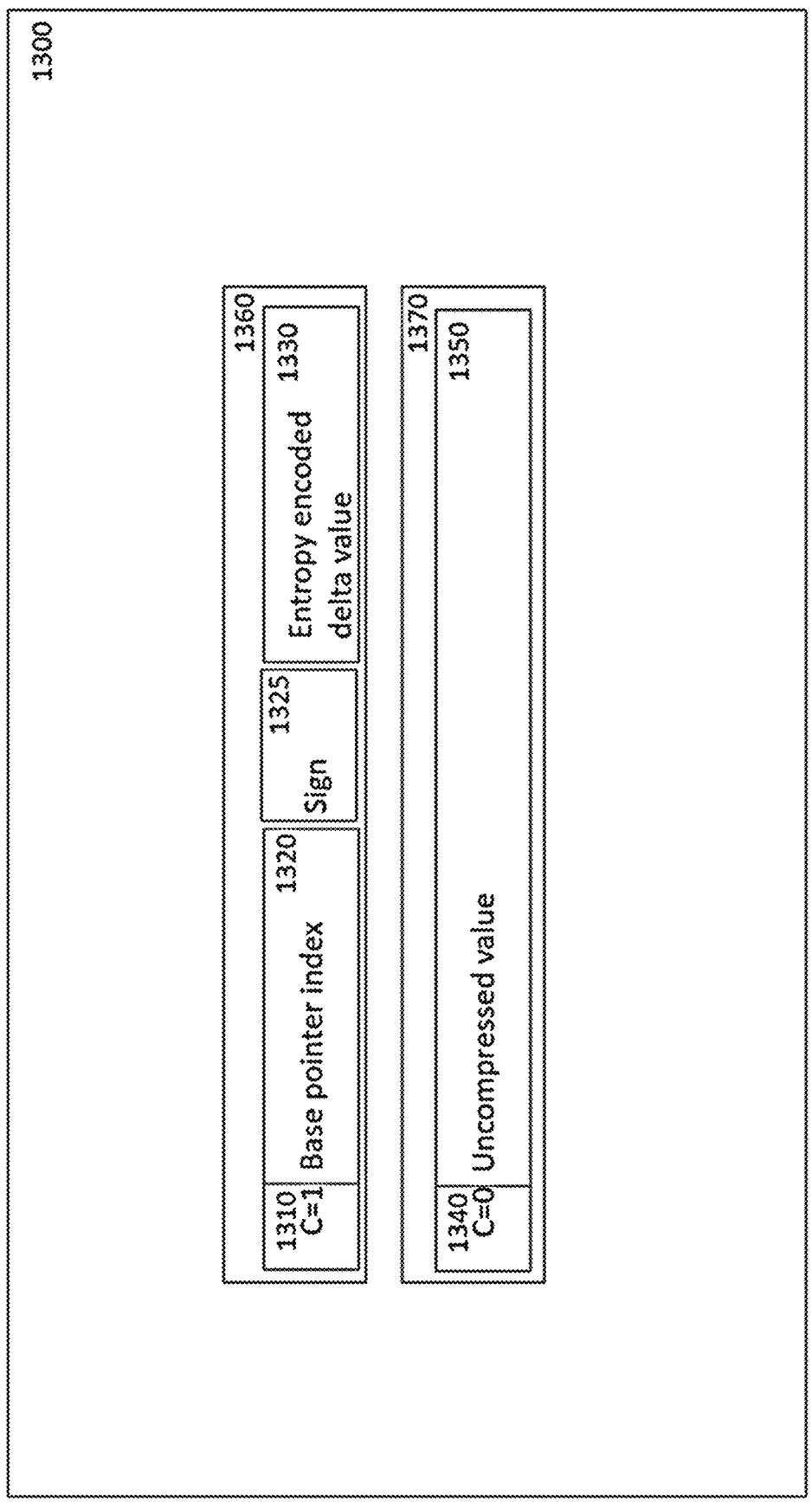
FIG. 13 depicts a metadata format of an entropy-based encoded delta value using global base values.

FIG. 13 depicts the metadata of an entropy-based encoded delta value using global base values. The metadata 1300 comes in two formats 1360 and 1370, used when the data value is compressed and uncompressed, respectively. Whether to compress or not may be based on whether the delta is lower than a preset threshold or according to some other criteria. Such methods and devices are also contemplated.

In the case when the data value is compressed, the first field 1310 (C) is set to one. The next three fields, 1320, 1325 and 1330 encode the base pointer index as in the metadata in FIG. 8. Field 1325 encodes the sign bit of the delta value which can be encoded with a single bit. 1330 comprises the entropy-based encoding of the delta value for the entropy-based encoding scheme selected. On the other hand, if it is uncompressed the first field 1340 (C) is set to zero. Then field 1350 comprises the uncompressed data.

Figure 14:
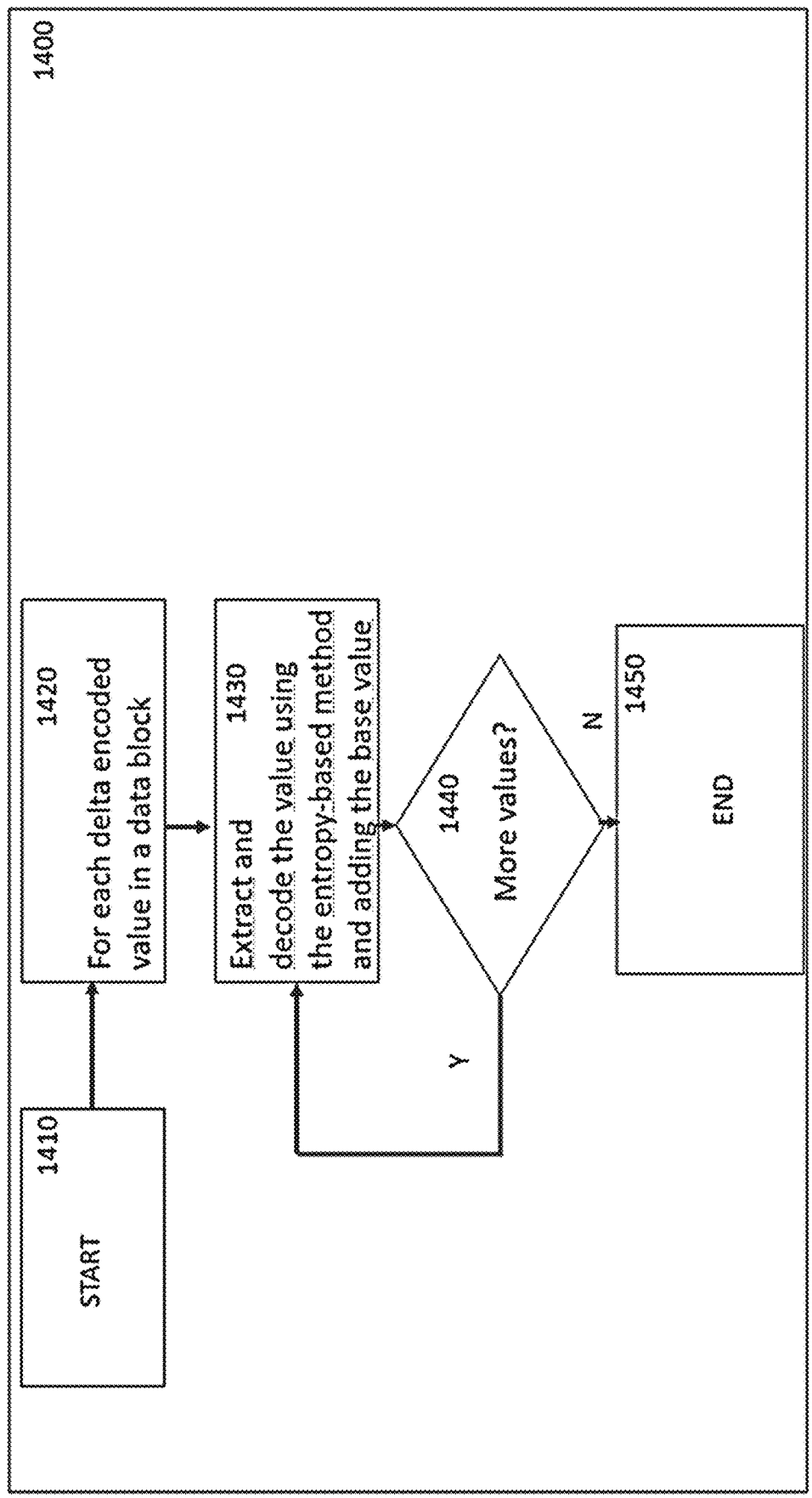
FIG. 14 depicts a method to decode delta values using entropy-based encoding.

We now turn our attention to how to decode a delta value that has been encoded with entropy-based coding. FIG. 14 depicts a method 1400 to decode delta values using entropy-based encoding. The process starts in box 1410. The objective is to decode all encoded delta values in a data block or in a plurality of data blocks as indicated by box 1420. A first step is to extract field 1330 in FIG. 13 in the case the delta value is compressed. The encoded delta value is then matched against the available codes using the entropy-based coding scheme selected in box 1430. When the delta value has been decoded, the global base value is retrieved from a global-base-value table using field 1320 in FIG. 13. In the case the value is not compressed, no action is taken in step 1430. This process is repeated for as long as there are more encoded values as shown in decision box 1440. When there are no more values, the process terminates in box 1450.

Figure 15:
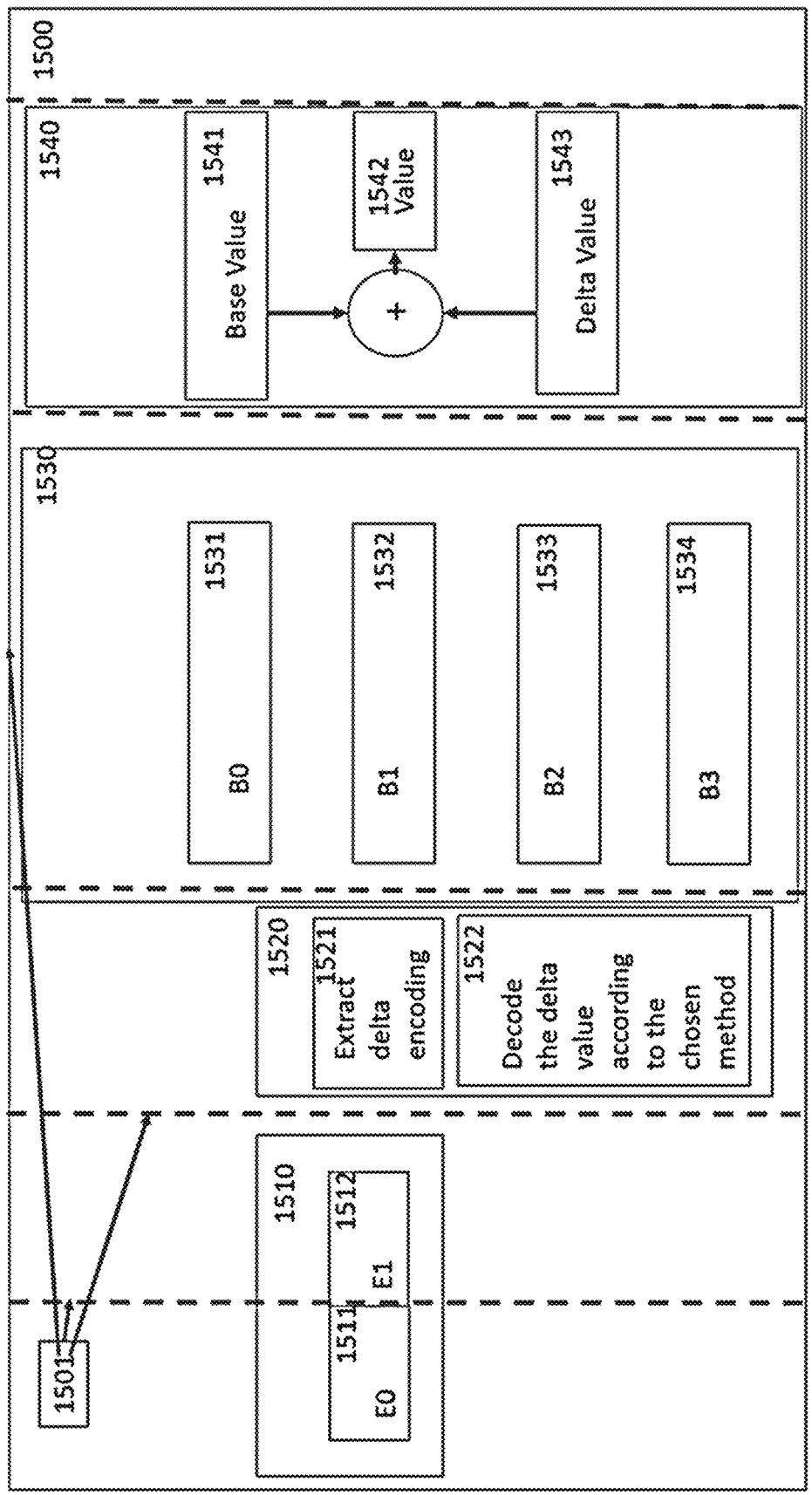
FIG. 15 depicts a device configured to decode delta values using entropy-based encoding.

FIG. 15 depicts a device 1500 configured to decode delta values using entropy-based encoding according to the method of FIG. 14. The exemplary device 1500 uses as input a plurality of encoded values according to the metadata fields in FIG. 13. In the exemplary device, according to drawing 1500, there are two encoded values 1511 (E0) and 1512 (E1). Device 1520 is configured to extract the entropy-based encoding of the delta value 1521 and to decode the delta value using a device 1522 configured to do so in accordance to a selected entropy-based encoding scheme. Device 1522 could be implemented by any suitable decompressor, as is generally well known to the skilled person. Reference is for instance made to the Huffman decompressor 300 or 700 which is disclosed in FIGS. 3 and 7, respectively, of WO 2020/130929, the contents of which is incorporated herein in its entirety by reference. The end result will be a delta-encoded data value according to the metadata formats in FIG. 8. The base pointer index field 820 selects one of a plurality of the global-base-value entries. In the exemplary device 1500, there are four global-base-value entries 1531 (B0), 1532 (B2), 1533 (B3) and 1534 (B4). One of the entries is selected and the global base pointer value in that entry is copied to base value register 1541. The delta value field 830 in FIG. 8 is copied to the delta value register 1543. Next, the device is configured to add the base value 1541 to the delta value 1543. The sum is loaded into register 1542 in which the original value is retrieved.

In another embodiment, it is desirable to decode values with a high throughput. To this end, example pipeline registers are placed between functional blocks and represented as dashed lines 1501 to illustrate an example of such a pipelined device.

Figure 21:
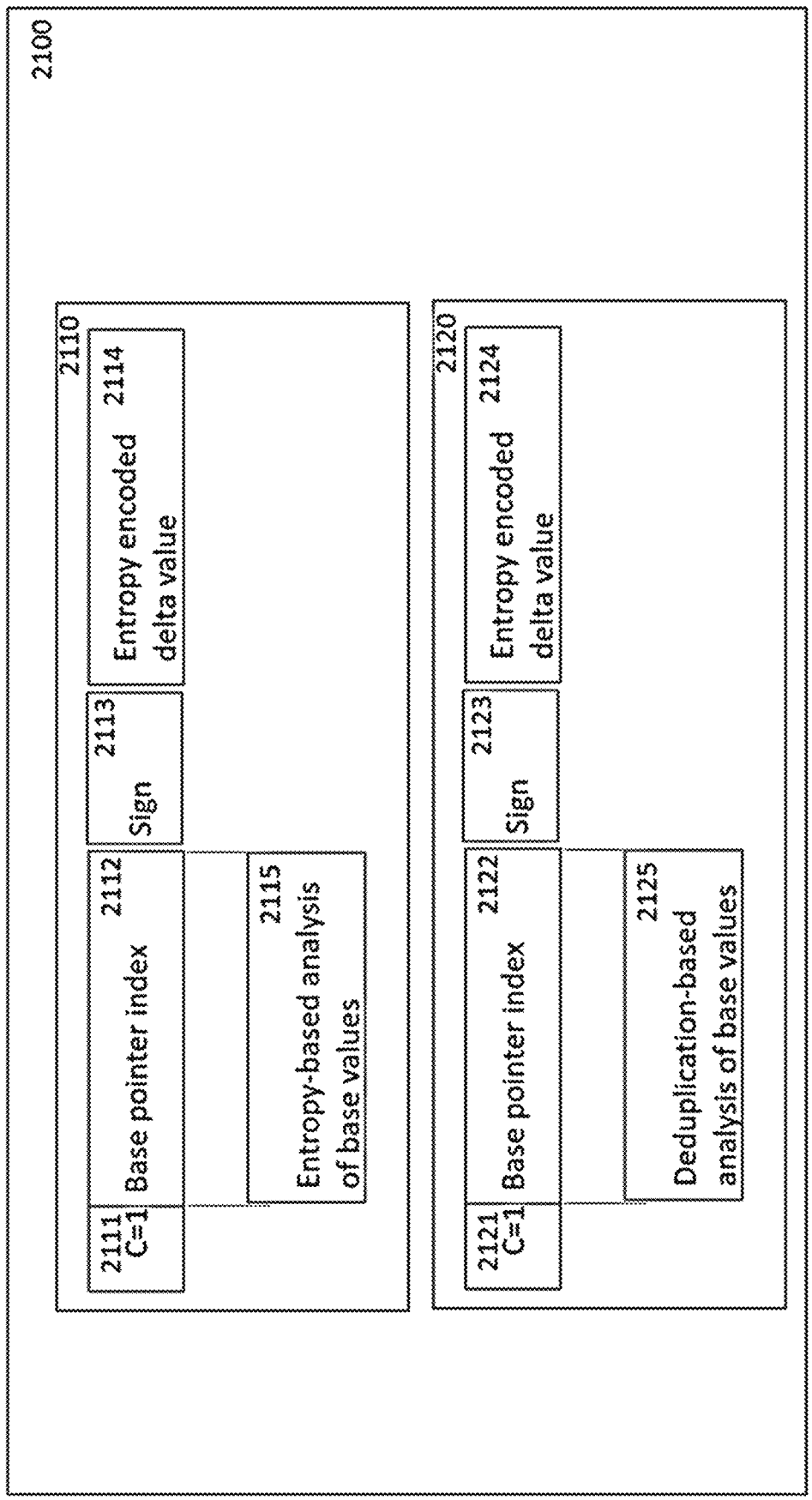
FIG. 21 depicts a metadata format of an entropy-based encoded delta value using global base values as a refinement of the metadata format depicted in FIG. 13, with either entropy-based encoding or deduplication being separately applied to the base-pointer-index values.

In yet another embodiment, one could separately apply entropy-based encoding to the base-pointer-index value in 1320 in FIG. 13. This can yield higher compression when one base value is more frequently used than another. FIG. 21 shows the metadata format of FIG. 13 and how one embodiment could select to analyze the frequency of base-pointer values 2115 using any of the methods and devices configured to do so as disclosed in this patent.

In an additional embodiment, one could apply deduplication. This would yield higher compression when a value or a whole data block is the same as another data value or another data block. FIG. 21 additionally shows the metadata format of FIG. 13 and how one embodiment could select to analyze the occurrence of duplicates among base-pointer values 2125 using any of the methods and devices configured to do so as disclosed in this patent. The same approach can be applied to delta values. Here, one can select to analyze the occurrences of duplicates among delta values using any of the methods and devices configured to do so as disclosed in this patent.

Figure 27:
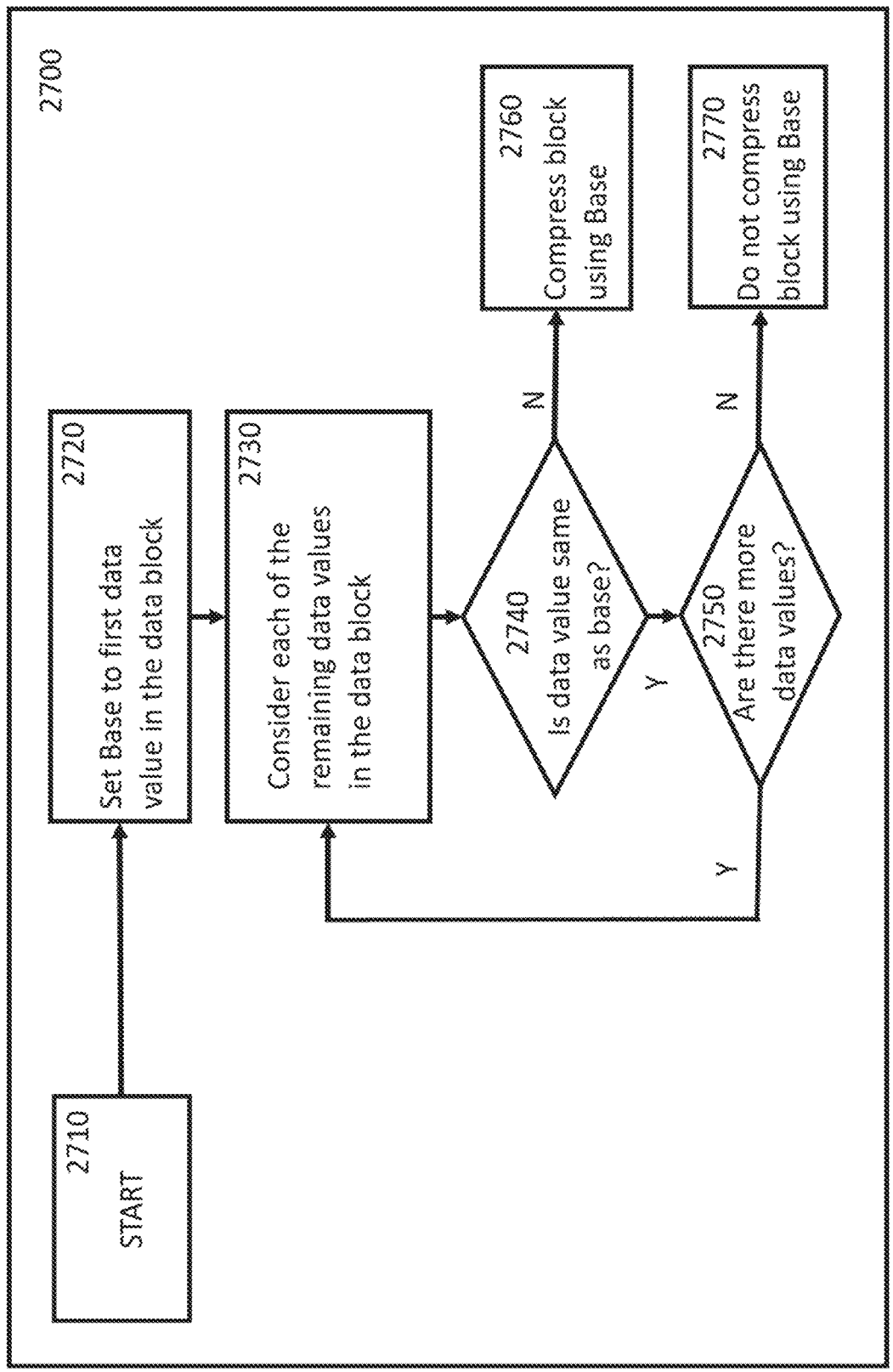
FIG. 27 depicts a method to compress a data block when all data words are the same using said word as a base.

In alternative or in addition to the method depicted in FIG. 11, if all data values in a block of data are the same, one could use any of them as a base data value with a single bit to depict that all values are the same. FIG. 27 depicts a compression method 2700 based on this principle. The process starts in 2710. The first step is to set the Base to the same value as the first data value in a data block 2720. Next, each of the remaining data values in a data block is considered 2730 by comparing it to Base 2740. If the current data value is the same as Base, the process continues by considering the next data value for as long as there are more values to consider 2750. On the other hand, going back to 2740, if the current data value is not the same as Base, the process terminates, and the data block will not be compressed 2760. When all data values have been considered and found to be the same as Base, the process terminates 2770 and the data block will be compressed.

Figure 28:
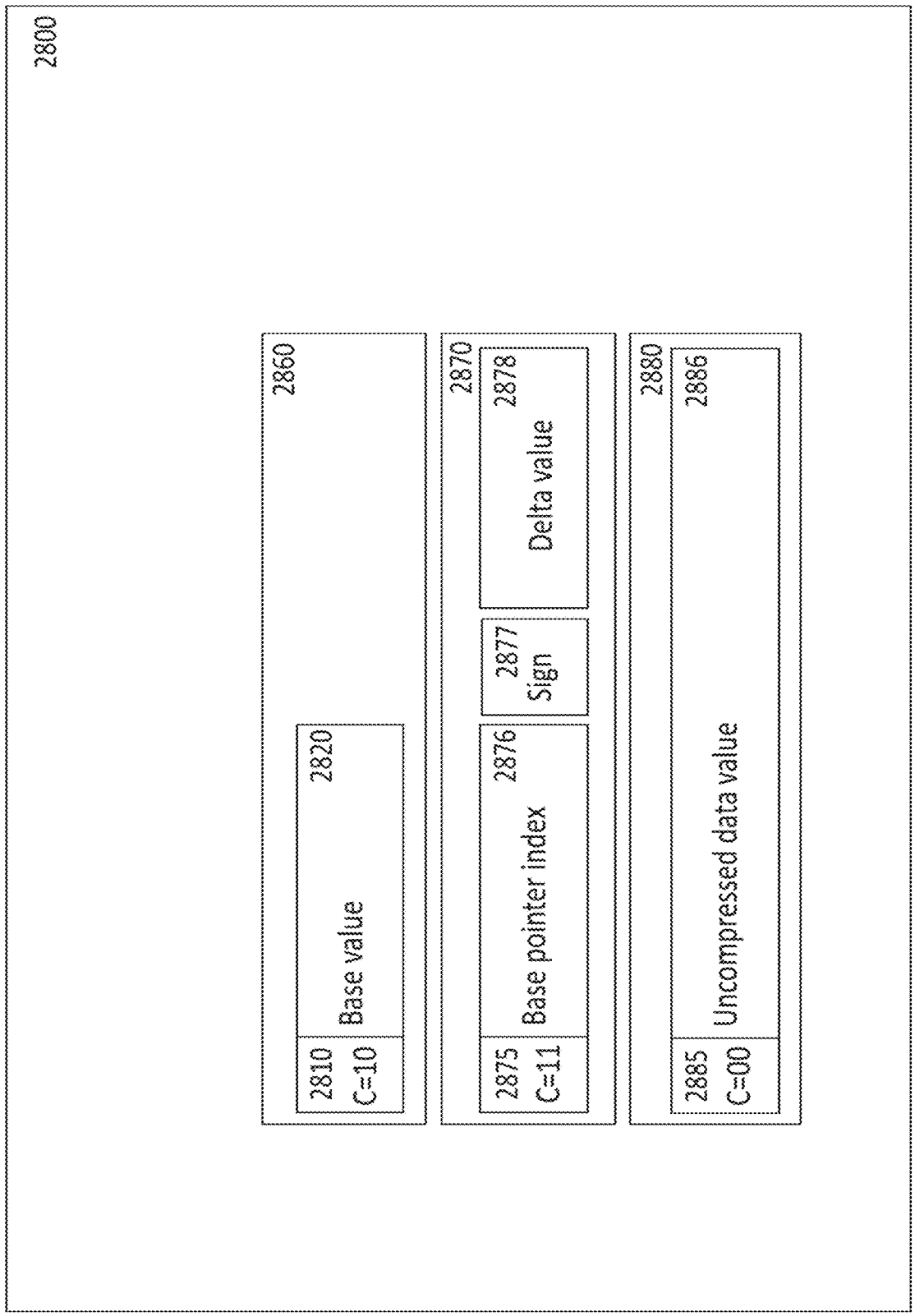
FIG. 28 depicts a metadata format to represent an encoding comprising different encodings including when all data words are the same.

FIG. 28 depicts an exemplary layout of how a block of data is compressed using the method depicted in FIG. 27 2860, or in addition if said method is unable to compress the block but instead compressing the block according to the method depicted in FIG. 6 where each value in the block is compressed using the format 2870 or if neither method can compress the block storing each uncompressed data value as is using the format 2880.

In a block that is compressed using the method depicted in FIG. 27 all data values are the same. Hence, the block is compressed by storing one instance of the same values, the Base value 2820. To establish that said method is used a two-bit code C 2810 is set to 10. On the other hand, if the method according to FIG. 6 is used, each data value is encoded with the delta to a selected base value. The selected base value can be encoded in field 2876, the delta can be encoded in field 2878 and the sign bit can be encoded in the Sign field 2877. To establish that said method is used and the C field 2875 is set to 11. Finally, if neither of said methods can compress the data block, all the data values will be stored in uncompressed format and the layout of 2880 is used. Here, each value is stored uncompressed and the C field 2885 is set to 00. If only the method of FIG. 27 is used an optimization to consider is to use a single C field for the entire data block.

Hence, the data compression method may involve determining whether all data values of an individual data block among the plurality of data blocks have the same value, and, if so, encoding the whole individual data block using said same value as global base value 2820 and meta data 2810 having a first value to indicate this. If not, the data values of the individual data block may be encoded with the method as disclosed in this document (i.e., involving selected global base values and resulting delta values, e.g. the method in FIG. 6) using meta data 2875 having a second value to indicate this, expect for uncompressed data values which are indicated by meta data 2885 having a third value.

Figure 29:
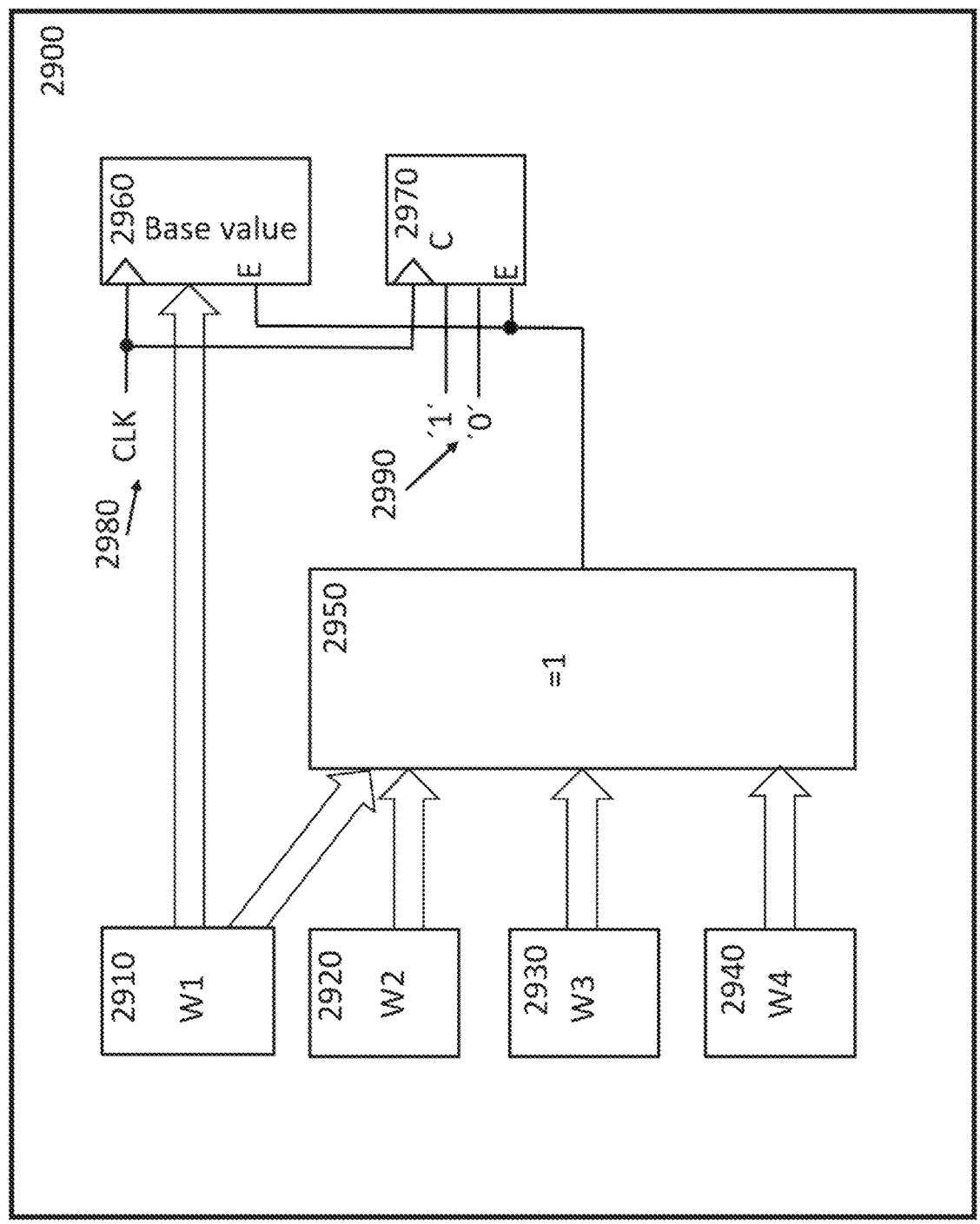
FIG. 29. depicts a device configured to encode a data block when all data words are the same using said word as a base.

FIG. 29 depicts a device configured to compress a block of data with the method depicted in FIG. 27 and the metadata layout depicted in FIG. 28. The input to the device 2900 is a data block that in the exemplary embodiment of FIG. 29 comprises four data words: W1 2910, W2 2920, W3 2930 and W4 2940. A device 2950 is configured to establish whether all the data words contain the same value or not. Said device will leave as output a logical one if they are the same and a logical zero if they are not the same. Let's denote bit i of word n as Wn[i]. The meaning of all data words being the same means that W1[i]=W2[i]=W3[i]=W4[i] for all bits in the word. Someone skilled in the art realizes how the device 2950 can be constructed with X0R and AND gates. The output signal is connected to the enable input of the two latches denoted 2960 and 2970. When all the words in the data block are the same, the content of W1 2910 will be latched into the base value latch 2960 at the next clock signal 2980. Likewise, when all the data words are the same, the two metadata bits of the metadata format 2860 in FIG. 28 must be '1' and '0'. To latch in '1' and '0' into the two-bit latch 2970, said latch also has an enable signal controlled by device 2950 that will latch in '1' and '0 at the next clock signal 2980. Someone skilled in the art realizes that in case C is not '1' and '0' but has another logical two-bit value, it is possible to generate other encodings for example 2870 or 2880 in the metadata layouts 2800 in FIG. 28.

Figure 30:
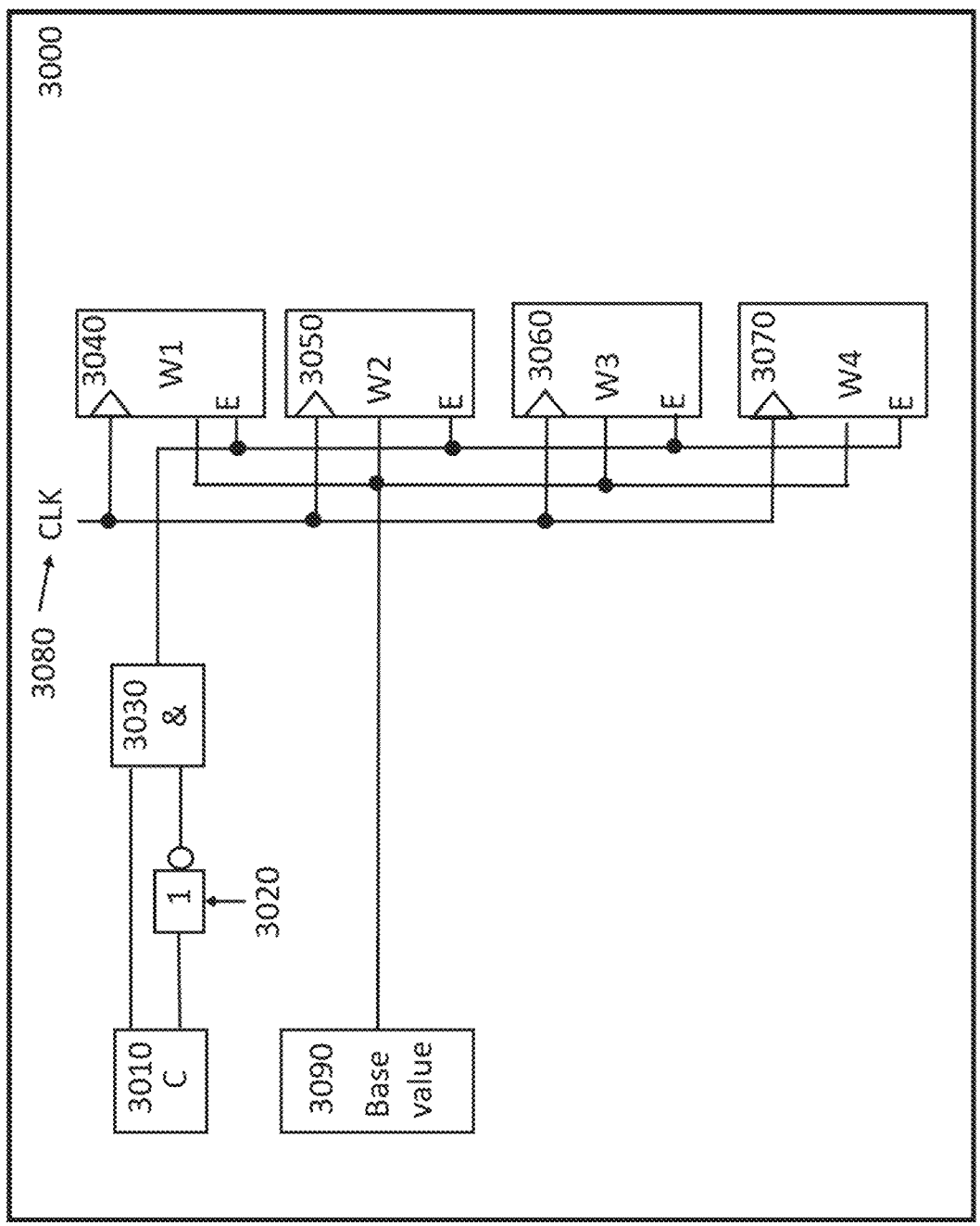
FIG. 30 depicts a device configured to decompress a data block when all data words are the same.

FIG. 30 depicts a device configured to decompress a block of data with the method depicted in FIG. 27 and the metadata layout depicted in FIG. 28. The input to the device 3000 is the metadata C 3010 and the base value 3090. If C=10 according to the layout 2860 in FIG. 28, the base value is copied to all the data words in the block. The exemplary data block in the device 3000 comprises four data words W1 3040, W2 3050, W3 3060 and W4 3070. They are configured as latches each with an enable signal E that at the next clock signal CLK 3080 will transfer the content of the base value register 3090 to all the latches if the E signals have the logical value 1. The E signals will have the logical value 1 if and only if C 3010 is 10 which is ascertained by the inverter gate 3020 connected to one of the input signals to the AND gate 3030. Someone skilled in the art will realize that in case C is not 10 but has another logical value, it is possible to load a different set of values into the word latches W1-W4 3040, 3050, 3060 and 3070, respectively; for example, the set of uncompressed words according to metadata layout 2880 in FIG. 28.

Figure 31:
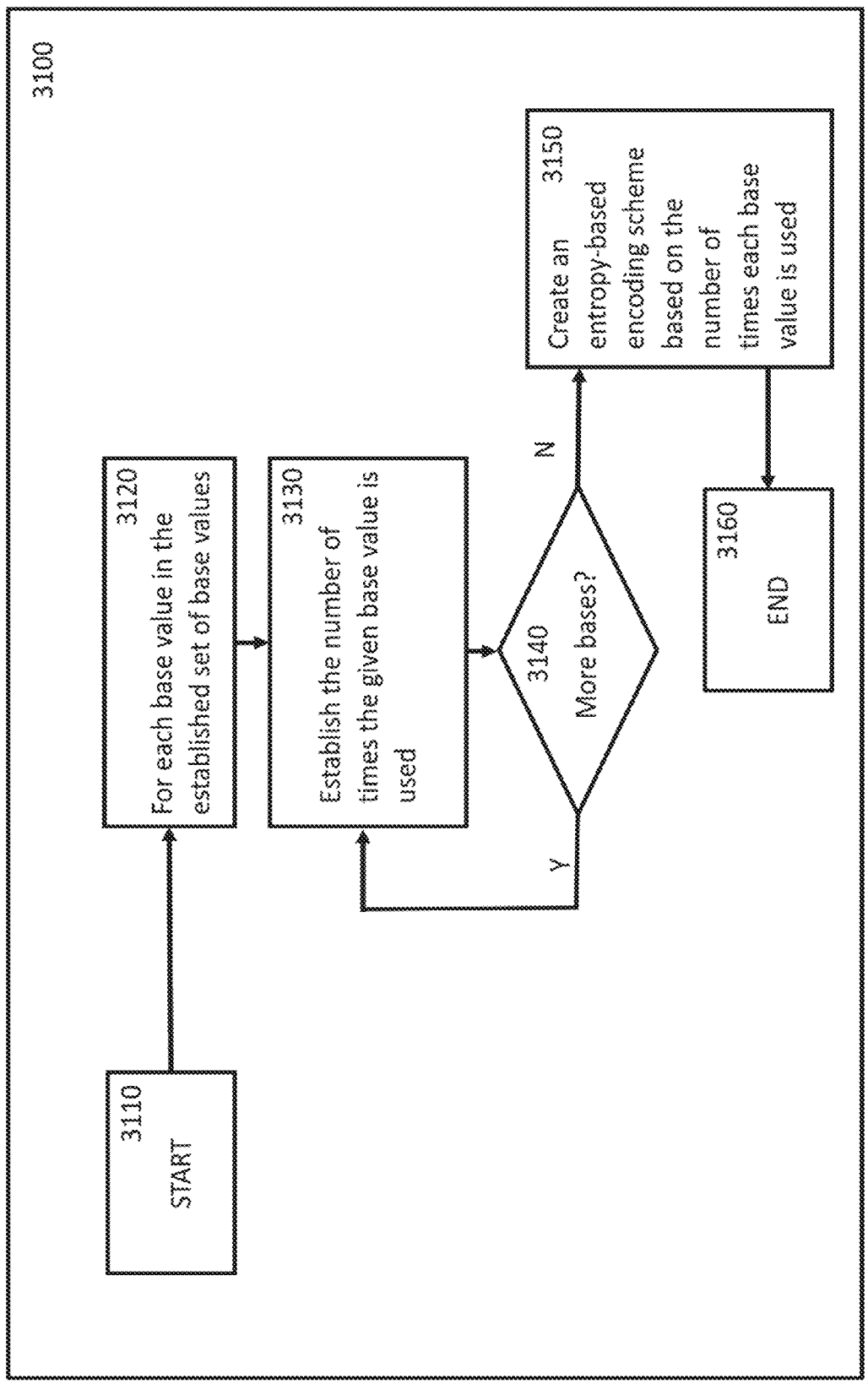
FIG. 31 depicts a method to compress a data block using entropy-based encoding of base values.

Base values are typically encoded using a base value pointer (a.k.a. base value index) to a table storing all of them using log 2N bits per reference given N base values. It may happen that some base values are substantially more often used than others. Then it is beneficial to encode base value pointers using entropy-based encoding schemes such as Huffman or arithmetic coding. FIG. 31 shows a method for encoding base value pointers using entropy-based encoding schemes.

Turning to FIG. 31, the process starts in 3110. The overall process considers all base values having been established by for example the method described in conjunction with FIG. 5. The number of times each base value (or its base value pointer) is used is established for each base value in 3130. When all base values have been considered, the process proceeds to 3150 after the decision box 3140. An entropy-based encoding is based on the number of times all base values are used yielding shorter codes for base values more frequently being used than those that are less frequently used. When the encoding is established the process terminates in 3160.

It is possible to construct a device configured to compress a block of data with the method depicted in FIG. 31 by the teachings of devices that compress blocks storing the base value pointers explicitly as in FIG. 7. Going back to FIG. 7, the task of the device 750, further elaborated on in FIG. 20 is to create an encoding where the base value pointer for the selected base value is explicitly stored. The method described in FIG. 31 establishes a one-to-one mapping between base-value pointers and entropy-based encodings. This table can be stored in a small table in the device which is loaded when compression is enabled. Hence, when the base-value pointer has been established in 750, this pointer can index into a table to pick up the corresponding encoding for that base-value pointer.

It is also possible to construct a device configured to decompress a block of data with the method depicted in FIG. 31 by the teachings of devices that decompress blocks and storing the base value pointers explicitly as in FIG. 8. FIG. 10 shows an embodiment of a device to decompress such encodings. Here, the exemplary block has two values E0 1011 and E1 1012 that may use four base values B0 1021, B1 1022, B3 1023 and B4 1024. These base values are encoded in the code word using any entropy-based encoding scheme with a one-to-one mapping between a code word and a base value. As in the aforementioned device to encode, it is possible to have a small table that contains the set of base value encodings and base values indexing into it using the encodings to retrieve the base value. Such a device can be incorporated to the left of the box 1020 in FIG. 10 to retrieve the base values to be used in 1020. One example of a suitable device is the decompression device disclosed in U.S. Ser. No. 10/846,218, which is incorporated herein by reference in its entirety.

In general, this patent disclosure teaches methods and devices configured to compress a plurality of data blocks, each comprising a plurality of data values by determining a set of global base values and using base-delta encoding. Additionally, it teaches methods and devices configured to compress in combination with entropy-based and deduplication-based encoding techniques from prior art applied to delta values in isolation or base values in isolation or together. All such embodiments are contemplated.

Figure 22:
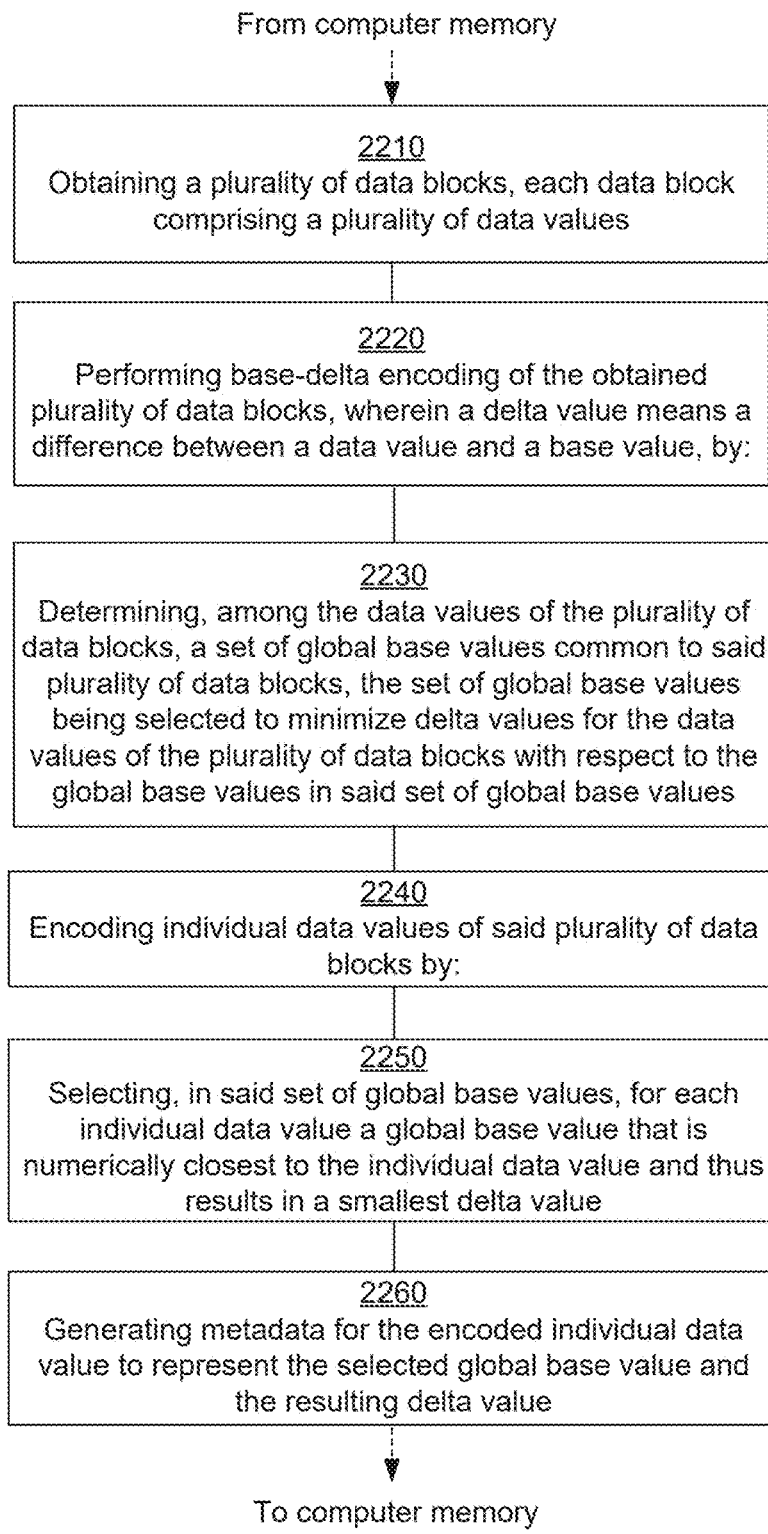
FIG. 22 depicts a data compression method according to the present invention.

As the skilled reader will have understood from the preceding description, the present invention provides a data compression method which can be seen at 2200 in FIG. 22. The method 2200 involves obtaining 2210 a plurality of data blocks, wherein each data block comprises a plurality of data values. The method 2200 further involves 2220 performing base-delta encoding of the obtained plurality of data blocks, wherein a delta value means a difference between a data value and a base value, by determining 2230, among the data values of the plurality of data blocks, a set of global base values common to the plurality of data blocks. The set of global base values is selected to minimize delta values for the data values of the plurality of data blocks with respect to the global base values in the set of global base values.

The method 2200 then involves encoding 2240 individual data values of the plurality of data blocks by selecting 2250, in the set of global base values, for each individual data value a global base value that is numerically closest to the individual data value and thus results in a smallest delta value, and generating 2260 metadata for the encoded individual data value to represent the selected global base value and the resulting delta value.

As will be clear to the skilled person from the teachings in this document, the set of global base values will include those data values which:

a) appear in the plurality of data blocks to be delta-encoded ("common", "global"), and b) will result in the smallest delta values (highest compression ratio) when the data values of the plurality of data blocks are base-delta encoded by employing the set of global base values in the way defined in the subsequent encoding step 2240.

As such, determining a set of global values that minimize delta values for a set of global values of a plurality of data blocks belongs to the common general knowledge and is known as clustering methods. For instance, one well-known clustering method is Kmeans (see Stuart P. Lloyd, Least Squares Quantization in PCM, IEEE Transactions on Information Theory, Vol. IT-28, No. 2, pp. 192, March 1982.

As has been described with particular reference to FIG. 4 and FIG. 5, determining 2230 the set of global base values may involve analyzing the obtained plurality of data blocks to establish value frequency information about the data values in the plurality of data blocks, and sorting the data values along with their value frequency in the plurality of data blocks. Then, for each particular combination of N=1 . . . Nmax and B=1 . . . N, where N is a number of value bins and B is a number of candidate base values, the sorted data values are divided into N bins. For the B bins with the highest cumulative value frequency, a candidate base value is assigned for each bin as the data value that has the highest value frequency in that bin. Then, base-delta encoding of the data values of the obtained plurality of data blocks is performed using the candidate base values for the B bins to determine a base-delta encoding compression ratio for the particular combination. Among all the particular combinations, the combination of value bins and candidate base values that yields the maximum compression ratio is identified. The candidate base values of the identified combination is selected as the set of global base values.

As is clear from the disclosed embodiments (see for instance the description of FIG. 6), each global base value preferably has a unique base value index in the set of global base values. Encoding 2240 the individual data values of the plurality of data blocks then involves representing the selected global base value in the generated metadata by its base value index.

Moreover, encoding 2240 the individual data values of the plurality of data blocks may involve determining, for each data value in each data block, whether the delta value resulting from the selected base value exceeds a threshold value, and, if so, generating the metadata to contain the data value itself together with an indication of it being uncompressed, instead of representing it by the selected global base value and the resulting delta value.

As was explained above, embodiments of the invention may involve run-length encoding of the delta values. Accordingly, the data compression method 2200 may further comprise run-length encoding delta values of the base-delta encoded data values that contain a strike of most significant binary 0:s or 1:s by representing a delta value in the generated metadata by the combination of a) data indicative of a length of the strike of most significant binary 0:s or 1:s, and b) the remainder of the delta value (non-strike part).

Similarly, embodiments of the invention may involve bit-plane compression of the delta values. To this end, the data compression method 2200 may further comprise applying bit-plane compression to a sequence of delta values of the base-delta encoded data values by identifying that each delta value in the sequence of delta values contains a strike of most significant binary 0:s or 1:s of a certain minimum length, and representing the delta values in the sequence of delta values in the generated metadata by the combination of a) data indicative of the identified minimum length, and b) the remainder of the delta values in the sequence of delta values (non-strike parts).

As has been explained above, advantageous embodiments of the invention involve compressing the delta values and/or the base value indices. Hence, the data compression method 2200 may further comprise obtaining the delta values/base value indices of the base-delta encoded data values of one or more of the base-delta encoded data blocks, and then performing a second stage data compression of said one or more base-delta encoded data blocks by exploiting value redundancy among the obtained delta values/base value indices.

The second stage data compression may preferably involve performing entropy-based encoding, such as Huffman encoding or arithmetic encoding, by establishing relative frequency information of the obtained delta values/base value indices, selecting a code for each obtained delta value/base value index based on the established relative frequency information, and representing, in the generated metadata for each base-delta encoded data value, the delta value/base value index by the selected code. As an alternative to performing entropy-based encoding upon the base value indices (or base value pointers), entropy-based encoding may be performed upon the base values themselves. This will result in base value codewords that can be used as base value indices mapped one-to-one with the base values.

Alternatively, the second stage data compression may involve performing a deduplication-based compression by identifying one or more duplicates among the obtained delta values/base value indices, and representing in the generated metadata each identified duplicate delta value/base value index by a pointer to or identifier of an encoded individual data value which has the same delta value as the duplicate delta value/base value index.

Obtaining 2210 the plurality of data blocks may typically involve reading a memory object from computer memory C1-C3, M1-Mk, 2410 (see FIG. 24), wherein the aforementioned plurality of data blocks is comprised in the memory object, and wherein the method 2200 further involves storing the generating metadata in the computer memory. The memory object may, for instance, be a page in the computer memory C1-C3, M1-Mk; 2410. Alternatively, the memory object can be, for instance, a cache line or another memory object of a size different than a memory page.

An associated computer program product comprises code instructions which, when loaded and executed by a processing device (such as, for instance, a CPU like P1, P2 or P3 in FIG. 2), cause performance of the data compression method 2200 as described above.

Figure 23:
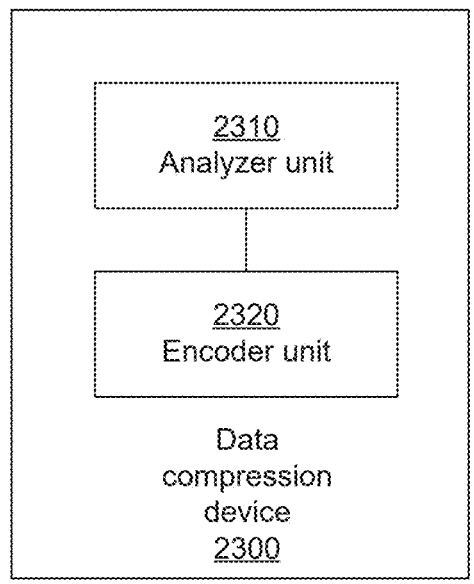
FIG. 23 depicts a data compression device according to the present invention.

FIG. 23 illustrates an associated data compression device 2300 (which may correspond to the computer memory compression device 205 in FIG. 2) for performing base-delta encoding of an obtained plurality of data blocks as described in this document. It is recalled that each data block comprises a plurality of data values, wherein a delta value means a difference between a data value and a base value. The data compression device 2300 comprises an analyzer unit 2310 (which may correspond to unit 214 in FIG. 2) and an encoder unit 2320 (which may correspond to unit 212 in FIG. 2).

The analyzer unit 2310 is configured for determining, among the data values of the plurality of data blocks, a set of global base values common to the plurality of data blocks. It is recalled that the set of global base values is selected to minimize delta values for the data values of the plurality of data blocks with respect to the global base values in the set of global base values.

The encoder unit 2320 is configured for encoding individual data values of the plurality of data blocks by selecting, in the set of global base values, for each individual data value a global base value that is numerically closest to the individual data value and thus results in a smallest delta value and generating metadata for the encoded individual data value to represent the selected global base value and the resulting delta value.

The data compression device 2300 with its analyzer unit 2310 and encoder unit 2320 may be configured for performing any or all of the additional or refined functionality as described above for the data compression method 2200 and its embodiments.

An associated data decompression method comprises obtaining the metadata as generated by the data compression method 2200, and reconstructing a plurality of data blocks, each data block comprising a plurality of data values, from the global base values and delta values represented by the obtained metadata. Furthermore, an associated computer program product comprises code instructions which, when loaded and executed by a processing device (such as, for instance, a CPU like $P_1$, $P_2$ or $P_3$ in FIG. 2), cause performance of this data decompression method.

Correspondingly, an associated data decompression device 2430 (see FIG. 24) comprises a decoder unit (which may correspond to unit 213 in FIG. 2). The decoder unit (e.g. 205) is configured for obtaining the metadata as generated by the data compression device 2300 (e.g. 205), and for reconstructing a plurality of data blocks, each data block comprising a plurality of data values, from the global base values and delta values represented by the obtained metadata.

Figure 24:
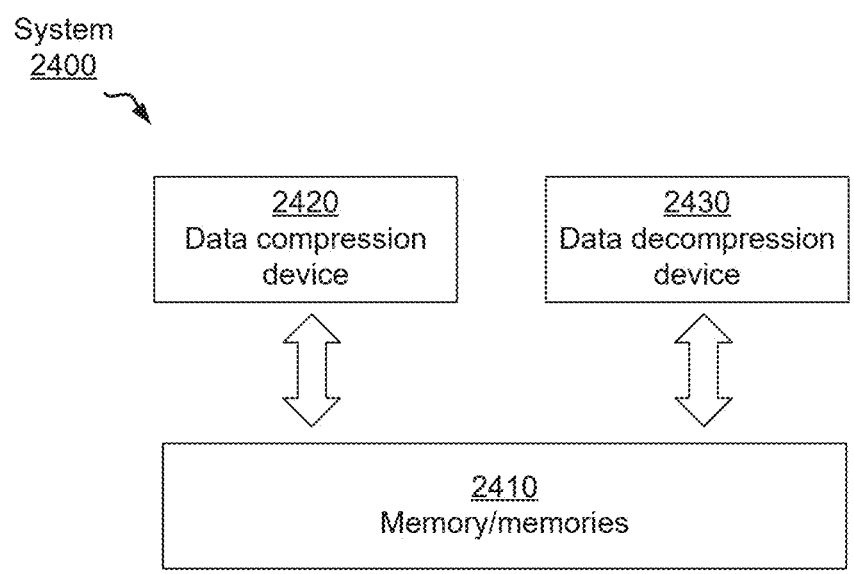
FIG. 24 depicts a system according to the present invention.

FIG. 24 discloses a system 2400 that comprises one or more memories 2410, a data compression device 2420 (which may correspond to the device 2300 in FIG. 23 and/or the device 205 in FIG. 2), as well as a data decompression device 2430 as referred to above.

The system 2400 may typically be a computer system (for instance computer system 200 in FIG. 2), and the one or more memories 2410 may be cache memories (for instance C1-C3), random access memories (for instance M1-Mk), secondary storages, or data buffers.

The invention has mainly been described above with reference to different embodiments thereof. However, as is readily appreciated by a person skilled in the art, other embodiments than the ones disclosed in this document are equally possible within the scope of the invention, as defined by the appended patent claims.

The invention claimed is:

1. A data compression method, comprising:
obtaining a plurality of data blocks, each data block comprising a plurality of data values; and
performing base-delta encoding of the obtained plurality of data blocks, wherein a delta value means a difference between a data value and a base value, by:
determining, among the data values of the plurality of data blocks, a set of global base values common to said plurality of data blocks, the set of global base values being selected to minimize delta values for the data values of the plurality of data blocks with respect to the global base values in said set of global base values; and
encoding individual data values of said plurality of data blocks by:
selecting, in said set of global base values, for each individual data value a global base value that is numerically closest to the individual data value and thus results in a smallest delta value; and
generating metadata for the encoded individual data value to represent the selected global base value and the resulting delta value.

2. The data compression method as defined in claim 1, wherein determining the set of global base values involves:
analyzing the obtained plurality of data blocks to establish value frequency information about the data values in the plurality of data blocks;
sorting the data values along with their value frequency in the plurality of data blocks;
for each particular combination of N=1 . . . . Nmax and B=1 . . . . N, where N is a number of value bins and B is a number of candidate base values:
dividing the sorted data values into N bins;
for the B bins with the highest cumulative value frequency, assigning a candidate base value for each bin as the data value that has the highest value frequency in that bin; and
performing base-delta encoding of the data values of the obtained plurality of data blocks using the candidate base values for the B bins to determine a base-delta encoding compression ratio for said particular combination;
identifying, among all the particular combinations, the combination of value bins and candidate base values that yields the maximum compression ratio; and
selecting the candidate base values of the identified combination as said set of global base values.

3. The data compression method as defined in claim 1, wherein each global base value has a unique base value index in said set of global base values, and wherein encoding the individual data values of said plurality of data blocks involves:
representing the selected global base value in the generated metadata by its base value index.

4. The data compression method as defined in claim 3, further comprising:
obtaining the base value indices of the base-delta encoded data values of one or more of the base-delta encoded data blocks; and
performing a second stage data compression of said one or more base-delta encoded data blocks by exploiting value redundancy among the obtained base value indices.

5. The data compression method as defined in claim 4, wherein the second stage data compression involves performing entropy-based encoding by:
establishing relative frequency information of the obtained base value indices;
selecting a code for each obtained base value index based on the established relative frequency information; and
representing, in the generated metadata for each base-delta encoded data value, the base value index by the selected code.

6. The data compression method as defined in claim 5, wherein the entropy-based encoding is selected from the group consisting of:
Huffman encoding; and
arithmetic encoding.

7. The data compression method as defined in claim 4, wherein the second stage data compression involves performing a deduplication-based compression by:
identifying one or more duplicates among the obtained base value indices; and
representing in the generated metadata each identified duplicate base value index by a pointer to or identifier of an encoded individual data value which has the same base value index as said duplicate base value index.

8. The data compression method as defined in claim 1, wherein encoding the individual data values of said plurality of data blocks involves, for each data block:
determining, for each data value in the data block, whether the delta value resulting from the selected base value exceeds a threshold value; and
if so, generating the metadata to contain the data value itself together with an indication of it being uncompressed, instead of representing it by the selected global base value and the resulting delta value.

9. The data compression method as defined in claim 8, wherein the threshold value is less than or equal to a maximum delta value being defined by the largest binary number having n bits, wherein:

n=min_compressed_value_size−log2(B), min_compressed_value_size is the minimum bit size of the encoded data values resulting from a given target compression ratio, and B is the number of base values in the set of global base values.

10. The data compression method as defined in claim 9, wherein the threshold value is defined for each respective base value in the set of global base values as:

the largest delta value associated with said respective base value, if the largest delta value is less than the maximum delta value; and otherwise the maximum delta value.

11. The data compression method as defined in claim 1, further comprising:

run-length encoding delta values of the base-delta encoded data values that contain a strike of most significant binary 0: s or 1: s by representing a delta value in the generated metadata by the combination of:

data indicative of a length of the strike of most significant binary 0: s or 1: s; and the remainder of the delta value (non-strike part).

12. The data compression method as defined in claim 1, further comprising:

applying bit-plane compression to a sequence of delta values of the base-delta encoded data values by:

identifying that each delta value in said sequence of delta values contains a strike of most significant binary 0: s or 1: s of a certain minimum length; and representing the delta values in said sequence of delta values in the generated metadata by the combination of:

data indicative of the identified minimum length; and the remainder of the delta values in said sequence of delta values (non-strike parts).

13. The data compression method as defined in claim 1, further comprising:

obtaining the delta values of the base-delta encoded data values of one or more of the base-delta encoded data blocks; and performing a second stage data compression of said one or more base-delta encoded data blocks by exploiting value redundancy among the obtained delta values.

14. The data compression method as defined in claim 13, wherein the second stage data compression involves performing entropy-based encoding by:

establishing relative frequency information of the obtained delta values;

selecting a code for each obtained delta value based on the established relative frequency information; and representing, in the generated metadata for each base-delta encoded data value, the delta value by the selected code.

15. The data compression method as defined in claim 14, wherein the entropy-based encoding is selected from the group consisting of:

Huffman encoding; and arithmetic encoding.

16. The data compression method as defined in claim 13, wherein the second stage data compression involves performing a deduplication-based compression by:

identifying one or more duplicates among the obtained delta values; and representing in the generated metadata each identified duplicate delta value by a pointer to or identifier of an encoded individual data value which has the same delta value as said duplicate delta value.

17. The data compression method as defined in claim 1, wherein the method involves:

i) determining whether all data values of an individual data block among said plurality of data blocks have the same value, and, if so, ii) as an exception to the encoding of individual data values of said plurality of data blocks, encoding the whole individual data block using said same value as global base value, wherein the metadata comprises a first value to indicate this iii) if not, encoding the data values of the individual data block the encoding of individual data values of said plurality of data blocks, wherein the metadata comprises a second value to indicate this, and iv) as an exception to iii), if the delta value resulting from the selected base value exceeds a threshold value for an individual data value in the data block, the metadata is generated to contain said individual data value itself together with an indication of it being uncompressed, the indication being a third value.

18. The data compression method as defined in claim 1, wherein obtaining the plurality of data blocks involves reading a memory object from computer memory, said plurality of data blocks being comprised in said memory object; and wherein the method further involves storing the generating metadata in said computer memory.

19. The data compression method as defined in claim 18, wherein the memory object is a page in said computer memory.

20. A data decompression method, comprising:

obtaining the metadata as generated by the data compression method according to claim 1; and reconstructing a plurality of data blocks, each data block comprising a plurality of data values, from the global base values and delta values represented by the obtained metadata.

21. A non-volatile computer-readable storage medium comprising a computer program comprising code instructions stored thereon, wherein the code instructions, when loaded and executed by a processing device, cause performance of the method according to claim 20.

22. A non-volatile computer-readable storage medium comprising a computer program comprising code instructions stored thereon, wherein the code instructions, when loaded and executed by a processing device, cause performance of the method according to claim 1.

23. A data compression device for performing base-delta encoding of an obtained plurality of data blocks, each data block comprising a plurality of data values, wherein a delta value means a difference between a data value and a base value, the data compression device comprising:

an analyzer unit configured for determining, among the data values of the plurality of data blocks, a set of global base values common to said plurality of data blocks, the set of global base values being selected to minimize delta values for the data values of the plurality of data blocks with respect to the global base values in said set of global base values; and an encoder unit configured for encoding individual data values of said plurality of data blocks by selecting, in said set of global base values, for each individual data value a global base value that is numerically closest to the individual data value and thus results in a smallest delta value, and generating metadata for the encoded individual data value to represent the selected global base value and the resulting delta value.

24. The data compression device as defined in claim 23, wherein the analyzer unit is configured for determining the set of global base values by:

analyzing the obtained plurality of data blocks to establish value frequency information about the data values in the plurality of data blocks;

sorting the data values along with their value frequency in the plurality of data blocks;

for each particular combination of N=1 . . . . Nmax and B=1 . . . . N, where N is a number of value bins and B is a number of candidate base values:

dividing the sorted data values into N bins;

for the B bins with the highest cumulative value frequency, assigning a candidate base value for each bin as the data value that has the highest value frequency in that bin; and performing base-delta encoding of the data values of the obtained plurality of data blocks using the candidate base values for the B bins to determine a base-delta encoding compression ratio for said particular combination;

identifying, among all the particular combinations, the combination of value bins and candidate base values that yields the maximum compression ratio; and selecting the candidate base values of the identified combination as said set of global base values.

25. The data compression device as defined in claim 23, wherein each global base value has a unique base value index in said set of global base values, and wherein the encoder unit is configured for encoding the individual data values of said plurality of data blocks by representing the selected global base value in the generated metadata by its base value index.

26. The data compression device as defined in claim 25, wherein the encoder unit is further configured for:

obtaining the base value indices of the base-delta encoded data values of one or more of the base-delta encoded data blocks; and performing a second stage data compression of said one or more base-delta encoded data blocks by exploiting value redundancy among the obtained base value indices.

27. The data compression device as defined in claim 23, wherein the encoder unit is configured for encoding the individual data values of said plurality of data blocks by determining, for each data value in each data block, whether the delta value resulting from the selected base value exceeds a threshold value, and, if so, generating the metadata to contain the data value itself together with an indication of it being uncompressed, instead of representing it by the selected global base value and the resulting delta value.

28. The data compression device as defined in claim 23, wherein the encoder unit is further configured for run-length encoding delta values of the base-delta encoded data values that contain a strike of most significant binary 0: s or 1: s by representing a delta value in the generated metadata by the combination of:

data indicative of a length of the strike of most significant binary 0: s or 1: s; and the remainder of the delta value (non-strike part).

29. The data compression device as defined in claim 23, wherein the encoder unit is further configured for applying bit-plane compression to a sequence of delta values of the base-delta encoded data values by:

identifying that each delta value in said sequence of delta values contains a strike of most significant binary 0: s or 1: s of a certain minimum length; and representing the delta values in said sequence of delta values in the generated metadata by the combination of:

data indicative of the identified minimum length; and the remainder of the delta values in said sequence of delta values (non-strike parts).

30. The data compression device as defined in claim 23, wherein the encoder unit is further configured for obtaining the delta values of the base-delta encoded data values of one or more of the base-delta encoded data blocks; and performing a second stage data compression of said one or more base-delta encoded data blocks by exploiting value redundancy among the obtained delta values.

31. The data compression device as defined in claim 23, further comprising a locator unit configured for obtaining the plurality of data blocks by reading a memory object from computer memory, said plurality of data blocks being comprised in said memory object, and for storing the generating metadata in said computer memory.

32. The data compression device as defined in claim 31, wherein the memory object is a page in said computer memory.

33. A data decompression device comprising a decoder unit, wherein the decoder unit is configured for obtaining the metadata as generated by the data compression device according to claim 23, and for reconstructing a plurality of data blocks, each data block comprising a plurality of data values, from the global base values and delta values represented by the obtained metadata.

34. A system comprising one or more memories, a data compression device for performing base-delta encoding of an obtained plurality of data blocks, each data block comprising a plurality of data values, wherein a delta value means a difference between a data value and a base value, the data compression device comprising:

an analyzer unit configured for determining, among the data values of the plurality of data blocks, a set of global base values common to said plurality of data blocks, the set of global base values being selected to minimize delta values for the data values of the plurality of data blocks with respect to the global base values in said set of global base values, and an encoder unit configured for encoding individual data values of said plurality of data blocks by selecting, in said set of global base values, for each individual data value a global base value that is numerically closest to the individual data value and thus results in a smallest delta value, and generating metadata for the encoded individual data value to represent the selected global base value and the resulting delta value; and the data decompression device comprising a decoder unit, wherein the decoder unit is configured for obtaining the metadata as generated by the data compression device, and for reconstructing a plurality of data blocks, each data block comprising a plurality of data values, from the global base values and delta values represented by the obtained metadata.

35. The system as defined in claim 34, wherein the system is a computer system and wherein said one or more memories are from the group consisting of:
- cache memories,
- random access memories,
- secondary storages, and
- data buffers.

* * * * *